US011804280B2

(12) United States Patent
Park et al.

(10) Patent No.: US 11,804,280 B2
(45) Date of Patent: Oct. 31, 2023

(54) NON-VOLATILE MEMORY DEVICE, OPERATING METHOD THEREOF, CONTROLLER FOR CONTROLLING THE SAME, AND STORAGE DEVICE HAVING THE SAME

(71) Applicant: SAMSUNG ELECTRONICS CO., LTD., Suwon-si (KR)

(72) Inventors: Sehwan Park, Yongin-si (KR); Jinyoung Kim, Seoul (KR); Ilhan Park, Suwon-si (KR); Kyoman Kang, Gunpo-si (KR); Sangwan Nam, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/749,607

(22) Filed: May 20, 2022

(65) Prior Publication Data
US 2022/0277801 A1    Sep. 1, 2022

Related U.S. Application Data

(63) Continuation of application No. 17/147,851, filed on Jan. 13, 2021, now Pat. No. 11,386,974.

(30) Foreign Application Priority Data

Jul. 22, 2020   (KR) .......................... 10-2020-0090763

(51) Int. Cl.
*G11C 29/50*   (2006.01)
*G11C 16/28*   (2006.01)
(Continued)

(52) U.S. Cl.
CPC ...... *G11C 29/50004* (2013.01); *G11C 7/1039* (2013.01); *G11C 7/1045* (2013.01);
(Continued)

(58) Field of Classification Search
CPC ... G11C 7/1039; G11C 7/1045; G11C 7/1057; G11C 7/1084; G11C 8/18; G11C 16/28;
(Continued)

(56) References Cited

U.S. PATENT DOCUMENTS 6,879,520 B2 * 4/2005 Hosono ............... G11C 11/5642
365/189.05
8,243,515 B2   8/2012 Park
(Continued)

FOREIGN PATENT DOCUMENTS

KR   1020170052390 A   5/2017
KR     102077811 B1    2/2020

*Primary Examiner* — Son L Mai
(74) *Attorney, Agent, or Firm* — Sughrue Mion, PLLC

(57) ABSTRACT

A non-volatile memory device includes a memory cell array including a plurality of memory blocks that includes a plurality of memory cells connected to a plurality of word lines and a plurality of bit lines, a row decoder configured to select one among the plurality of memory blocks, based on an address, a voltage generator configured to apply word line voltages corresponding to selected word lines and unselected word lines, among the plurality of word lines, page buffers connected to the plurality of bit lines and configured to read data from a memory cell connected to one among the selected word lines of the selected one among the plurality of memory blocks, and a control logic configured to control the row decoder, the voltage generator, and the page buffers.

19 Claims, 22 Drawing Sheets

(51) Int. Cl.
  *G11C 7/10* (2006.01)
  *G11C 8/18* (2006.01)
  *G11C 29/44* (2006.01)
  *G11C 29/12* (2006.01)

(52) U.S. Cl.
  CPC .......... *G11C 7/1057* (2013.01); *G11C 7/1084* (2013.01); *G11C 8/18* (2013.01); *G11C 16/28* (2013.01); *G11C 29/44* (2013.01); *G11C 2029/1202* (2013.01); *G11C 2029/1204* (2013.01)

(58) Field of Classification Search
  CPC .............. G11C 29/44; G11C 29/50004; G11C 2029/1202; G11C 2029/1204
  See application file for complete search history.

(56) References Cited

U.S. PATENT DOCUMENTS

| | | |
|---|---|---|
| 8,264,883 B2 | 9/2012 | Lim et al. |
| 8,627,257 B2 | 1/2014 | Kim et al. |
| 9,058,890 B2 | 6/2015 | Kang |
| 9,437,310 B2 | 9/2016 | Oh et al. |
| 9,570,184 B2 | 2/2017 | Mokhlesi |
| 9,685,206 B2 | 6/2017 | Choi et al. |
| 9,977,711 B2 | 5/2018 | Park |
| 10,229,749 B2 | 3/2019 | Oh et al. |
| 10,381,090 B2 | 8/2019 | Oh et al. |
| 10,424,388 B2 | 9/2019 | Oh et al. |
| 10,490,287 B2 | 11/2019 | Choo |
| 10,573,380 B2 | 2/2020 | Hwang |
| 10,607,708 B2 | 3/2020 | Oh et al. |
| 10,803,958 B2 * | 10/2020 | Bang .................... G11C 11/5671 |
| 10,937,508 B2 * | 3/2021 | Kim ....................... G11C 16/10 |
| 11,182,301 B2 * | 11/2021 | Ahn ....................... G06F 3/0659 |
| 2013/0083600 A1 | 4/2013 | Lee |
| 2014/0063944 A1 | 3/2014 | Lee |
| 2017/0123724 A1 | 5/2017 | Park et al. |
| 2020/0098433 A1 | 3/2020 | Jeon et al. |
| 2020/0098436 A1 | 3/2020 | Kim et al. |
| 2020/0151539 A1 | 5/2020 | Oh et al. |
| 2020/0152279 A1 | 5/2020 | Oh et al. |

\* cited by examiner

NON-VOLATILE MEMORY DEVICE, OPERATING METHOD THEREOF, CONTROLLER FOR CONTROLLING THE SAME, AND STORAGE DEVICE HAVING THE SAME

CROSS-REFERENCE TO RELATED APPLICATION

This is a continuation of U.S. application Ser. No. 17/147,851 filed Jan. 13, 2021, which claims benefit of priority to Korean Patent Application No. 10-2020-0090763 filed on Jul. 22, 2020, in the Korean Intellectual Property Office, the disclosure of which is incorporated herein by reference in its entirety.

BACKGROUND

The inventive concept relates to a non-volatile memory device.

In general, a storage device generates an error correction code using an error correction code (ECC) circuit, in a write operation, and the storage device corrects an error in data with reference to the error correction code, in a read operation. However, there are cases in which correction by the ECC circuit is impossible, because a degree of deterioration of memory cells of the storage device may be relatively severe. In this case, a read retry operation using a sensing technique, different from a normal read operation, may be performed.

SUMMARY

An aspect of the inventive concept is to provide a non-volatile memory device for improving reliability of data, an operating method thereof, a controller for controlling the same, and a storage device having the same.

An aspect of the inventive concept is to provide a non-volatile memory device for determining a cell state, an operating method thereof, a controller for controlling the same, and a storage device having the same.

An aspect of the inventive concept is to provide a non-volatile memory device for acquiring cell state information without deteriorating system performance, an operating method thereof, a controller for controlling the same, and a storage device having the same.

According to an aspect of the inventive concept, a non-volatile memory device includes a memory cell array including a plurality of memory blocks that includes a plurality of memory cells connected to a plurality of word lines and a plurality of bit lines. The non-volatile memory device further includes a row decoder configured to select one among the plurality of memory blocks, based on an address, a voltage generator configured to apply word line voltages corresponding to selected word lines and unselected word lines, among the plurality of word lines, page buffers connected to the plurality of bit lines and configured to read data from a memory cell connected to one among the selected word lines of the selected one among the plurality of memory blocks, and a control logic configured to control the row decoder, the voltage generator, and the page buffers. The control logic includes a heterogeneous multi-sensing circuit configured to perform a plurality of sensing operations for at least two threshold voltage distributions under different sensing conditions, based on a health checkup command, and output, to an external device, cell state information corresponding to the performed plurality of sensing operations.

According to an aspect of the inventive concept, a non-volatile memory device includes a memory cell region having a first metal pad, and a peripheral circuit region having a second metal pad, and connected to the memory cell region by the first metal pad and the second metal pad in a vertical direction. The non-volatile memory device includes a memory cell array disposed in the memory cell region, and including a plurality of memory blocks that includes a plurality of memory cells connected to a plurality of word lines and a plurality of bit lines. The non-volatile memory further includes a row decoder disposed in the peripheral circuit region, and configured to select one among the plurality of word lines, a page buffer circuit disposed in the peripheral circuit region, and including a plurality of page buffers connected to the plurality of bit lines, and a control logic disposed in the peripheral circuit region, and configured to receive a command latch enable (CLE) signal, an address latch enable (ALE) signal, a chip enable (CE) signal, a write enable (WE) signal, a read enable (RE) signal, and a data strobe (DQS) signal by control pins, and latch a command or an address at an edge of the received WE signal according to the received CLE signal and the received ALE signal, to perform a heterogeneous multi-sensing operation. The heterogeneous multi-sensing operation includes a plurality of sensing operations that is performed under different sensing conditions for at least two threshold voltage distributions.

According to an aspect of the inventive concept, a method of operating a non-volatile memory device includes receiving a health checkup command, based on the health checkup command being received, performing a heterogeneous multi-sensing operation under different sensing conditions, and outputting, to an external device, cell state information corresponding to the performed heterogeneous multi-sensing operation. The heterogeneous multi-sensing operation includes a plurality of sensing operations performed under the different sensing conditions, and a page buffer group respectively corresponding to the plurality of sensing operations is set.

According to an aspect of the inventive concept, a controller includes control pins configured to provide, to at least one non-volatile memory device, a command latch enable (CLE) signal, an address latch enable (ALE) signal, a chip enable (CE) signal, a write enable (WE) signal, a read enable (RE) signal, and data strobe (DQS) control signals. The controller further includes an error correction circuit configured to receive data of a first read operation, from the at least one non-volatile memory device, and correct at least one error within the received data. The controller further includes at least one processor configured to, based on the at least one error not being able to be corrected within the received data, issue a health checkup command, transmit the issued health checkup command to the at least one non-volatile memory device, receive cell state information corresponding to the transmitted health checkup command, from the at least one non-volatile memory device, change a read level, based on the received cell state information, and perform a second read operation in the at least one non-volatile memory device, based on the changed read level.

According to an aspect of the inventive concept, a storage device includes at least one non-volatile memory device, and a controller including control pins configured to provide, to the at least non-volatile memory device, a command latch enable (CLE) signal, an address latch enable (ALE)

signal, a chip enable (CE) signal, a write enable (WE) signal, a read enable (RE) signal, and a data strobe (DQS) signal, the controller being further configured to read data from the at least one non-volatile memory device. The at least one non-volatile memory device is configured to latch a health checkup command at an edge of the provided WE signal according to the provided CLE signal and the provided ALE signal, to perform a heterogeneous multi-sensing operation, and output, to the controller, cell state information corresponding to the performed heterogeneous multi-sensing operation. The heterogeneous multi-sensing operation includes a plurality of sensing operations that is performed under different sensing conditions for at least two threshold voltage distributions.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

In the following, the contents of the inventive concept will be described clearly and in detail to the extent that those of ordinary skill in the technical field of the inventive concept may easily implement it using the drawings.

A non-volatile memory device according to an embodiment of the inventive concept, a controller for controlling the same, a storage device including the same, and an operation method thereof may sample cell state information with respect to at least two threshold voltage distributions in response to a health checkup command, and may use the sampled cell state information to check a health state of a memory cell may be checked. In this case, the at least two threshold voltage distributions may correspond to the same word line in the same block, different word lines in the same block, or different word lines in different blocks.

Figure 1:
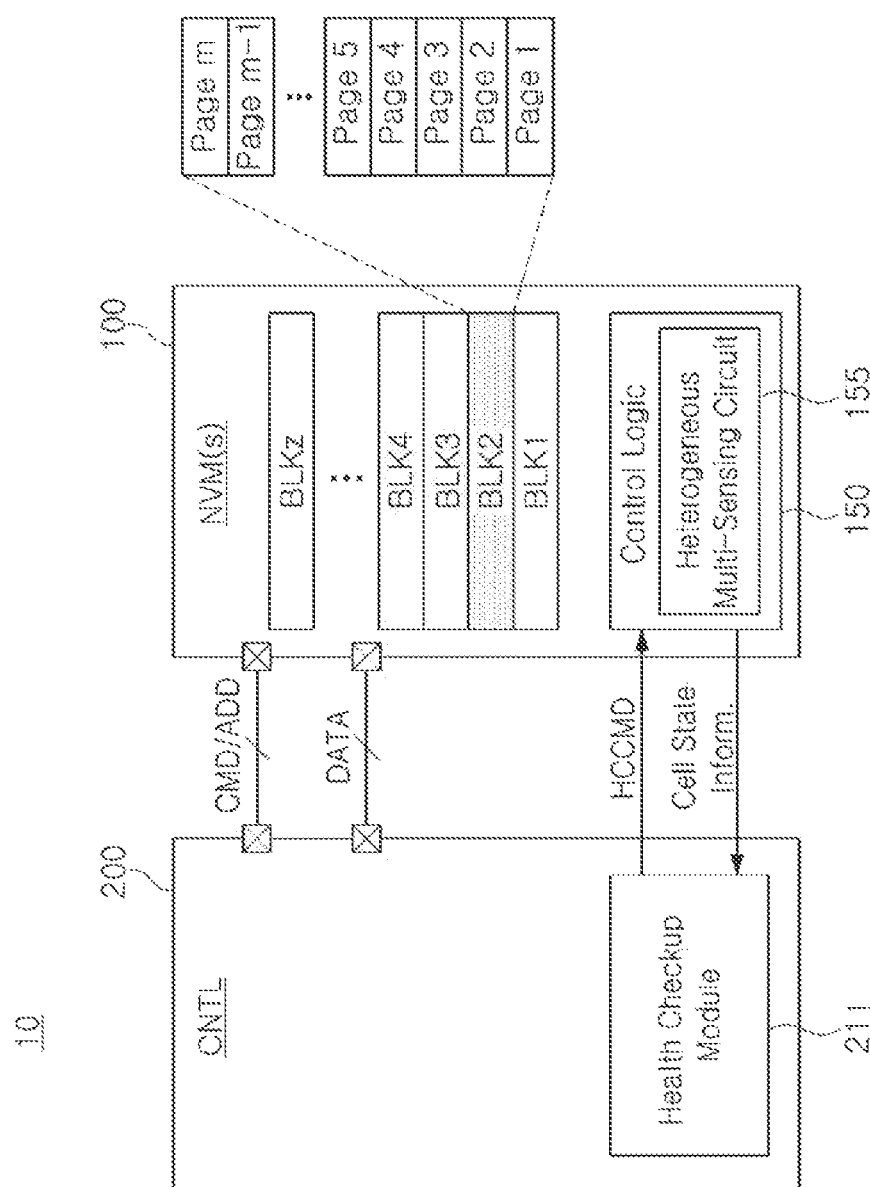
FIG. 1 is a view illustrating a storage device 10 according to an embodiment of the inventive concept.

FIG. 1 is a view illustrating a storage device 10 according to an embodiment of the inventive concept. Referring to FIG. 1, a storage device 10 may include at least one non-volatile memory device NVM(s) 100 and a controller CNTL 200.

At least one non-volatile memory device 100 may be implemented to store data. The non-volatile memory device 100 may be a NAND flash memory, a vertical NAND flash memory, a NOR flash memory, a resistive random access memory (RRAM), a phase-change memory (PRAM), a magnetoresistive random access memory (MRAM), ferroelectric random access memory (FRAM), spin transfer torque random access memory (STT-RAM), or the like. Also, the non-volatile memory device 100 may be implemented to have a three-dimensional array structure. The inventive concept may be applied to a flash memory device in which a charge storage layer is formed of a conductive floating gate, as well as a charge trap flash (CTF) memory device in which a charge storage layer is formed of an insulating film. In the following, for convenience of description, the non-volatile memory device 100 will be referred to as a vertical NAND (VNAND) flash memory device.

In addition, the non-volatile memory device 100 may be implemented to include a plurality of memory blocks BLK1 to BLKz, where z is an integer greater than or equal to 2, and a control logic 150.

Each of the plurality of memory blocks BLK1 to BLKz may include a plurality of pages Page 1 to Page m, where m is an integer greater than or equal to 2. Each of the plurality of pages Page 1 to Page m may include a plurality of memory cells. Each of the plurality of memory cells may store at least one bit.

The control logic 150 may receive a command CMD and an address ADD from the controller CNTL 200, and may be implemented to perform an operation (a program operation, a read operation, an erase operation, or the like) corresponding to the received command CMD in memory cells corresponding to the address ADD.

In addition, the control logic 150 may include a heterogeneous multi-sensing circuit 155. The heterogeneous multi-sensing circuit 155 may be implemented to sample cell state information with respect to at least two threshold voltage distributions by performing sensing operations under different sensing conditions. For example, the heterogeneous multi-sensing circuit 155 may perform a first sensing operation corresponding to a first threshold voltage distribution under a first sensing condition to acquire first pieces of sampling data, and may perform a second sensing operation corresponding to a second threshold voltage distribution under a second sensing condition to acquire second pieces of sampling data. In an embodiment, the first sensing condition and the second sensing condition may be different from each other. In an embodiment, each of the first and second sensing conditions may include voltage information (read level or the like) for a sensing operation, time information (pre-charge time, development time, recovery time, or the like), position information (physical position or similar), or the like.

The controller CNTL 200 may be connected to at least one non-volatile memory device 100 through a plurality of control pins transmitting control signals (e.g., a command latch enable (CLE) signal, an address latch enable (ALE) signal, a chip enable (CE) signal, a write enable (WE) signal, a read enable (RE) signal, and the like). Also, the controller CNTL 200 may be implemented to use the control signals (CLE, ALE, CE(s), WE, RE, or the like) to control the non-volatile memory device 100. For example, the non-volatile memory device 100 may latch a command (CMD) or an address (ADD) at an edge of the WE signal according to the CLE signal and the ALE signal, to perform program operation/read operation/erase operation.

In addition, the controller 200 may include a health checkup module 211. The health checkup module 211 may be implemented in hardware, software, or firmware. The health checkup module 211 may be executed by at least one processor in the controller 200.

In general, a storage device may use cell state information with respect to a threshold voltage distribution in a non-volatile memory device to improve reliability of a memory cell. The technology for improving the reliability of the memory cell using such cell state information may be filed as IP applications by Samsung Electronics, and may be described in U.S. Pat. Nos. 9,437,310, 9,977,711, 10,424,388, US 2020/0151539, US 2020/0152279, U.S. Pat. Nos. 10,229,749, 10,381,090, and 10,607,708, which are incorporated by reference herein.

In general, to identify a threshold voltage distribution for setting an optimal read level, a storage device may determine on/off cells by a first read operation of a first read level, and may determine on/off cells by a second read operation of a second read level, among cells determined as off cells, to output cell count data. As described above, because a method for setting a read level performs two read operations, the method may be inferior in performance, as compared to a method using a conventional pre-defined table (PDT).

The storage device 10 according to an embodiment of the inventive concept may output cell state information with respect to at least two threshold voltage distributions under different sensing conditions in a single read operation, to improve latency performance, as compared to a conventional one.

Figure 2:
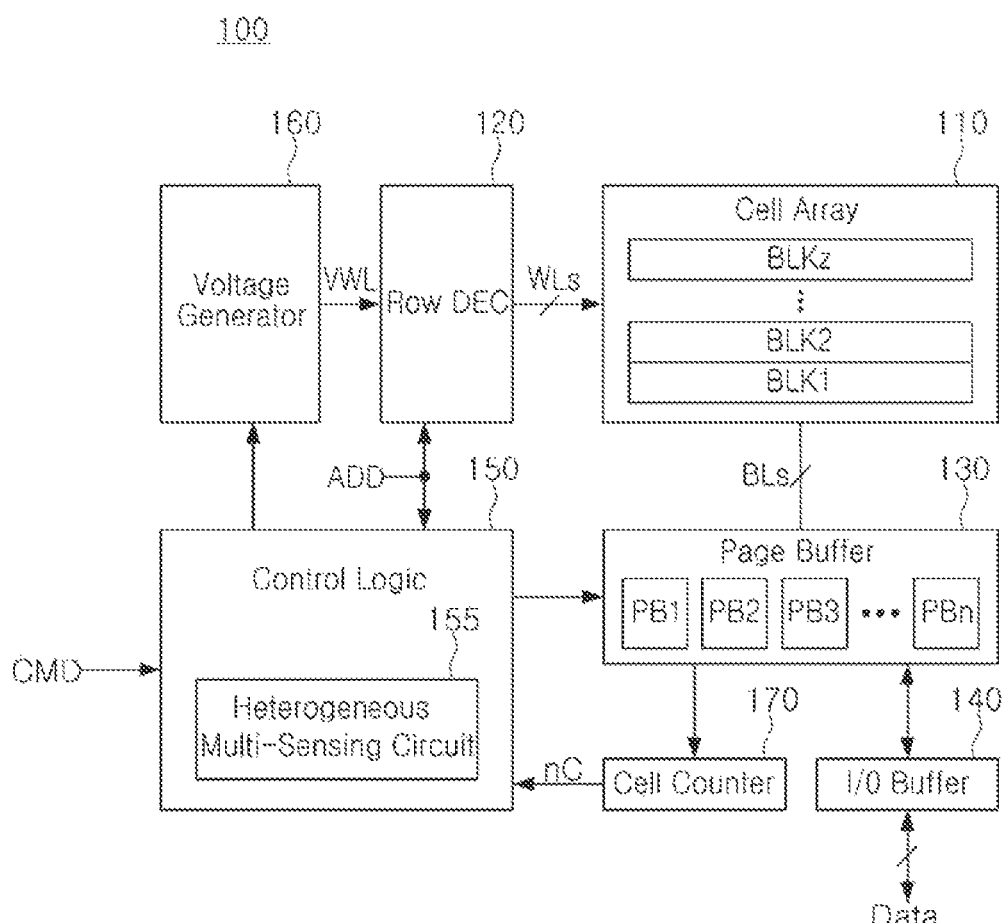
FIG. 2 is a view illustrating the non-volatile memory device 100 illustrated in FIG.

FIG. 2 is a view illustrating the non-volatile memory device 100 illustrated in FIG. 1. Referring to FIG. 2, the non-volatile memory device 100 may include a memory cell array 110, a row decoder 120, a page buffer circuit 130, an input/output buffer circuit 140, a control logic 150, a voltage generator 160, and a cell counter 170.

The memory cell array 110 may be connected to the row decoder 120 through word lines WLs, or select lines SSL and GSL. The memory cell array 110 may be connected to the page buffer circuit 130 through bit lines BLs. The memory cell array 110 may include a plurality of cell strings. Each channel of the cell strings may be formed in a vertical direction or a horizontal direction. Each of the cell strings may include a plurality of memory cells. In this case, the plurality of memory cells may be programmed, erased, or read by a voltage provided to the bit lines BLs or the word lines WLs. In general, a program operation may be performed on a page basis, and an erase operation may be performed on a block basis.

The row decoder 120 may be implemented to select any of the memory blocks BLK1 to BLKz of the memory cell array 110 in response to an address ADD. The row decoder 120 may select any of word lines of a selected memory block in response to the address ADD. The row decoder 120 may transfer a word line voltage VWL corresponding to an operation mode to the word lines of the selected memory block. During a program operation, the row decoder 120 may apply a program voltage and a verify voltage to a selected word line, and may apply a pass voltage to an unselected word line. During a read operation, the row decoder 120 may apply a read voltage to a selected word line, and may apply a read pass voltage to an unselected word line.

The page buffer circuit 130 may be implemented to operate as a write driver or a sensing amplifier. During a program operation, the page buffer circuit 130 may apply a bit line voltage corresponding to data to be programmed to the bit lines of the memory cell array 110. During a read operation or a verify read operation, the page buffer circuit 130 may sense data stored in the selected memory cell through the bit line BL. A plurality of page buffers PB1 to PBn included in the page buffer circuit 130, where n is an integer greater than or equal to 2, may be connected to at least one bit line, respectively.

Each of the plurality of page buffers PB1 to PBn may be implemented to perform sensing and latching for an OVS operation. For example, each of the plurality of page buffers PB1 to PBn may perform a plurality of sensing operations to identify one state stored in the selected memory cells under control of the control logic 150. In addition, after each of the plurality of page buffers PB1 to PBn stores data sensed by the plurality of sensing operations, one data may be selected under the control of the control logic 150. For example, each of the plurality of page buffers PB1 to PBn may perform the plurality of sensing operations to identify the one state. In addition, each of the plurality of page buffers PB1 to PBn may select or output optimal data, among a plurality of data, sensed according to the control of the control logic 150.

The input/output buffer circuit 140 may provide, data externally provided, to the page buffer circuit 130. The input/output buffer circuit 140 may provide, a command CMD externally provided, to the control logic 150. The input/output buffer circuit 140 may provide an address ADD, externally provided, to the control logic 150 or the row decoder 120. In addition, the input/output buffer circuit 140 may externally output data sensed and latched by the page buffer circuit 130.

The control logic 150 may be implemented to control the row decoder 120 and the page buffer circuit 130 in response to a command CMD externally transmitted.

The control logic 150 may include a heterogeneous multi-sensing circuit 155 for acquiring cell state information with respect to at least two threshold voltage distributions in response to a health checkup command (HCCMD, see FIG. 1).

The heterogeneous multi-sensing circuit 155 may be implemented to control the page buffer circuit 130 and the voltage generator 160 for a heterogeneous multi-sensing operation. In this case, the heterogeneous multi-sensing operation may include sensing operations for at least two threshold voltage distributions under different sensing conditions. In addition, the heterogeneous multi-sensing circuit 155 may control the plurality of page buffers PB1 to PBn, to store sensing data corresponding to each of the results of a plurality of sensing operations in a plurality of latch sets provided in each of the plurality of page buffers PB1 to PBn.

For example, the heterogeneous multi-sensing circuit 155 may perform a first sensing operation for a first threshold voltage distribution in a first read level with respect to first memory cells corresponding to a first page buffer group (e.g., odd page buffers) in response to a health checkup command HCCMD, and may perform a second sensing operation for a second threshold voltage distribution in a second read level with respect to second memory cells corresponding to a second page buffer group (e.g., even page buffers) in response to a health checkup command HCCMD. The heterogeneous multi-sensing circuit 155 may output on/off cell information stored in the first page buffer group according to the first sensing operation and the on/off cell information stored in the second page buffer group according to the second sensing operation, as cell state information corresponding to the health checkup command HCCMD, to the controller 200 (see FIG. 1).

The control logic 150 may be implemented to perform processing for selecting optimal data among a plurality of sensed data. To select the optimal data, the control logic 150 may refer to a count result nC provided from the cell counter 170.

The voltage generator 160 may be implemented to generate various types of word line voltages to be respectively applied to word lines under control of the control logic 150 and a well voltage to be supplied to a bulk (e.g., well region) in which memory cells are formed. The word line voltages respectively applied to the word lines may include a program voltage, a pass voltage, a read voltage, read pass voltages, or the like.

The cell counter 170 may be implemented to count the number of memory cells corresponding to a threshold voltage range from data sensed by the page buffer circuit 130.

For example, the cell counter 170 may process data respectively sensed in the plurality of page buffers PB1 to PBn, to count the number of memory cells having a threshold voltage in a threshold voltage range.

The non-volatile memory device 100 according to an embodiment of the inventive concept may perform a heterogeneous multi-sensing operation in response to a health checkup command HCCMD, to output cell state information with respect to a threshold voltage distribution in a single read operation.

Figure 3:
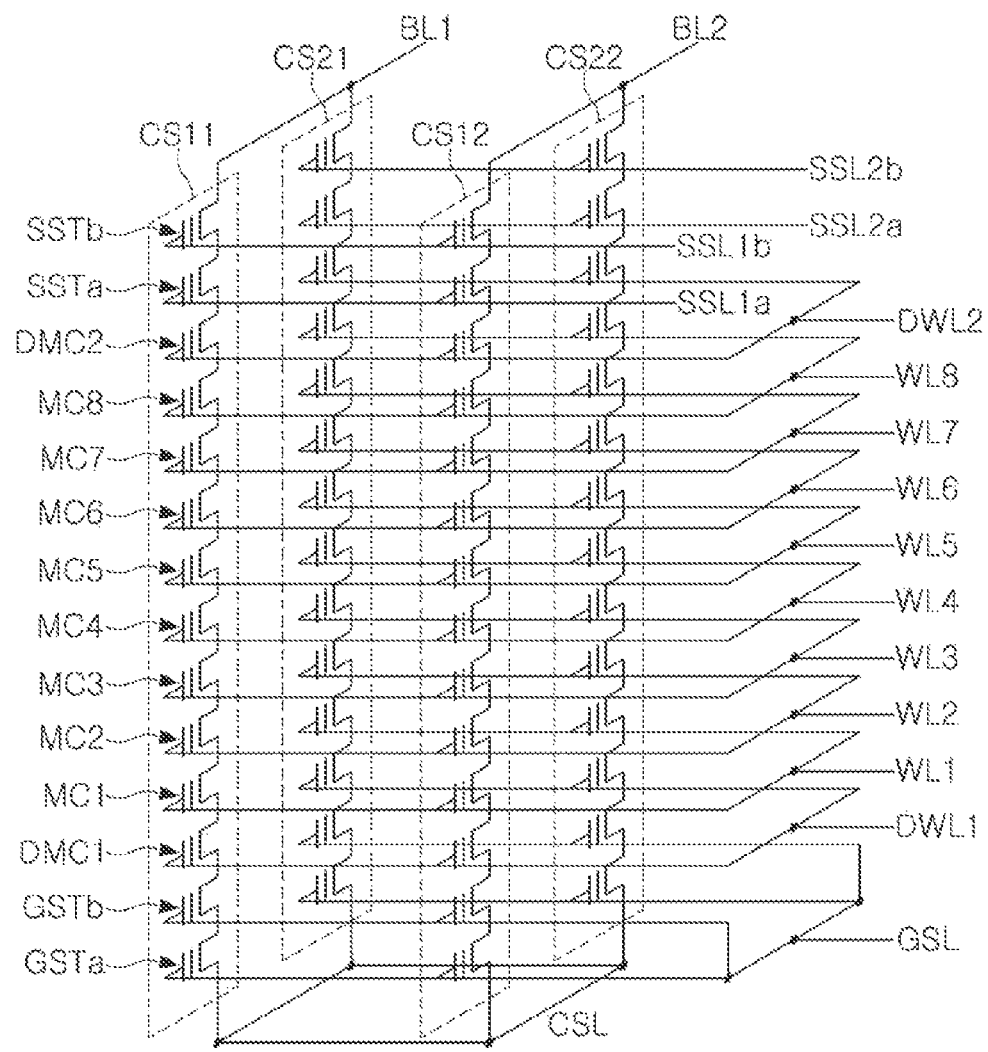
FIG. 3 is a view illustrating a circuit diagram of one memory block BLK1 of the memory blocks illustrated in FIG. 1.

FIG. 3 is a view illustrating a circuit diagram of one memory block BLK1 of the memory blocks illustrated in FIG. 1. Referring to FIG. 3, a first memory block BLK1 having a three-dimensional structure is illustrated. The first memory block BLK1 may include a plurality of cell strings CS11, CS12, CS21, and CS22. The plurality of cell strings CS11, CS12, CS21, and CS22 may be arranged in a row direction and a column direction, to form rows and columns.

In an embodiment, the cell strings CS11 and CS12 may be connected to string select lines SSL1a and SSL1b to form a first row. The cell strings CS21 and CS22 may be connected to string select lines SSL2a and SSL2b to form a second row. For example, the cell strings CS11 and CS21 may be connected to a first bit line BL1 to form a first column. The cell strings CS12 and CS22 may be connected to a second bit line BL2 to form a second column.

The plurality of cell strings CS11, CS12, CS21, and CS22 may include a plurality of cell transistors, respectively. For example, the plurality of cell strings CS11, CS12, CS21, and CS22 may include string select transistors SSTa and SSTb, a plurality of memory cells MC1 to MC8, ground select transistors GSTa and GSTb, and dummy memory cells DMC1 and DMC2, respectively. For example, the plurality of cell transistors included in the plurality of cell strings CS11, CS12, CS21, and CS22 may be a charge trap flash (CTF) memory cell, respectively.

The plurality of memory cells MC1 to MC8 may be connected in series, and may be stacked in a height direction, perpendicular to a plane formed by the row direction and the column direction. The string select transistors SSTa and SSTb may be connected in series, and the string select transistors SSTa and SSTb connected in series may be provided between the plurality of memory cells MC1 to MC8 and the bit lines BLs. The ground select transistors GSTa and GSTb may be connected in series, and the ground select transistors GSTa and GSTb connected in series may be provided between the plurality of memory cells MC1 to MC8 and a common source line CSL.

In an embodiment, a first dummy memory cell DMC1 may be provided between the plurality of memory cells MC1 to MC8 and the ground select transistors GSTa and GSTb. For example, a second dummy memory cell DMC2 may be provided between the plurality of memory cells MC1 to MC8 and the string select transistors SSTa and SSTb.

The ground select transistors GSTa and GSTb of the cell strings CS11, CS12, CS21, and CS22 may be commonly connected to a ground select line GSL. For example, ground select transistors of the same row may be connected to the same ground select line, and ground select transistors of different rows may be connected to different ground select lines. For example, first ground select transistors GSTa of the cell strings CS11 and CS12 of the first row may be connected to the first ground select line. Similarly, among second string select transistors SSTb having the same height, string select transistors of the same row may be connected to the same string select line, and string select transistors of different rows may be connected to different string select lines. For example, the second string select transistors SSTb of the cell strings CS11 and CS12 of the first row may be commonly connected to the string select line SSL1b, and the second string select transistors SSTb of the cell strings CS21 and CS22 of the second row may be commonly connected to the string select line SSL2b.

String select transistors of cell strings of the same row may be commonly connected to the same string select line. For example, first and second string select transistors SSTa and SSTb of the cell strings CS11 and CS12 of the first row may be commonly connected to the same string select line. First and second string select transistors SSTa and SSTb of the cell strings CS21 and CS22 of the second row may be commonly connected to the same string select line.

In an embodiment, dummy memory cells having the same height may be connected to the same dummy word line, and dummy memory cells having different heights may be connected to different dummy word lines. For example, the first dummy memory cells DMC1 may be connected to a first dummy word line DWL1, and the second dummy memory cells DMC2 may be connected to a second dummy word line DWL2.

In the first memory block BLK1, an erase operation may be performed on a memory block or sub-block basis. When the erase operation is performed on a memory block basis, all of the memory cells MC of the first memory block BLK1 may be simultaneously erased according to a single erase request. When performed on a memory sub-block basis, portions of the memory cells MC of the first memory block BLK1 may be simultaneously erased according to a single erase request, and erase operation of others thereamong may be prohibited. A low voltage (e.g., a ground voltage) may be supplied to word lines connected to erased memory cells, and word lines connected to erase-prohibited memory cells may be floated.

The first memory block BLK1 illustrated in FIG. 3 is illustrative. Lines GSL, WL, DWL, SSL, or the like, connected to cell transistors, are not limited by the number of cell strings, the number of rows, the number of columns, the number of cell transistors (GST, MC, DMC, SST, or the like), or the number of cell transistors, according to the inventive concept.

Figure 4:
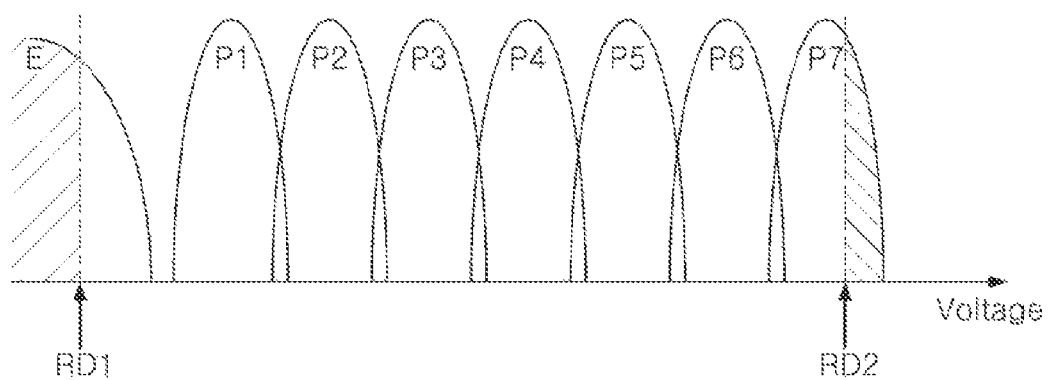
FIG. 4 is a view illustrating a read level used to identify a threshold voltage distribution in a non-volatile memory device 100 according to an embodiment of the inventive concept.

FIG. 4 is a view illustrating a read level used to identify a threshold voltage distribution in a non-volatile memory device 100 according to an embodiment of the inventive concept. Referring to FIG. 4, eight (8) states E, and P1 to P7 are illustrated. To identify a threshold voltage distribution of memory cells of a non-volatile memory device 100, first cell state information corresponding to an erase state E, and second cell state information corresponding to the highest program state P7 may be required.

In an embodiment, the first cell state information may include on-cell information (or first pieces of sampling data) according to a first sensing operation of a first read level. In this case, the first read level may be a read level corresponding to the erasing state E.

In an embodiment, the second cell state information may include off-cell information (or second pieces of sampling data) according to a second sensing operation of a second read level. In this case, the second read level may be a read level corresponding to the highest program state P7.

It may be understood that the erase state E and the program state P7 selected to identify the threshold voltage distribution, in FIG. 4, are only illustrative. In the inventive concept, at least two states may be selected in various manners to identify the threshold voltage distribution.

A non-volatile memory device 100 according to an embodiment of the inventive concept may output pieces of sampling data for identifying a cell distribution by a heterogeneous multi-sensing operation. In this case, in the heterogeneous multi-sensing operation, data sensed under various conditions may be sampled in a single page. To this end, the page buffer circuit 130 (refer to FIG. 1) may be divided into two or more page buffer groups. The page buffer groups may store pieces of sampling data sensed under different conditions, respectively. The non-volatile memory device 100 may output the pieces of sampling data of each of the page buffer groups to direct memory access (DMA) having a single page size.

Figure 5A:
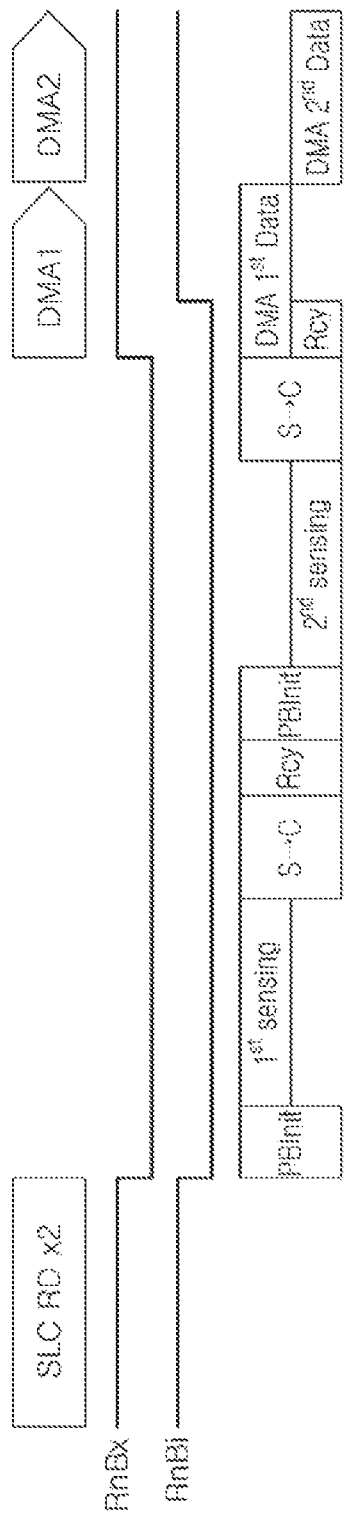
FIGS. 5A and 5B are views illustrating a heterogeneous multi-sensing operation according to an embodiment of the inventive concept.
Figure 5B:
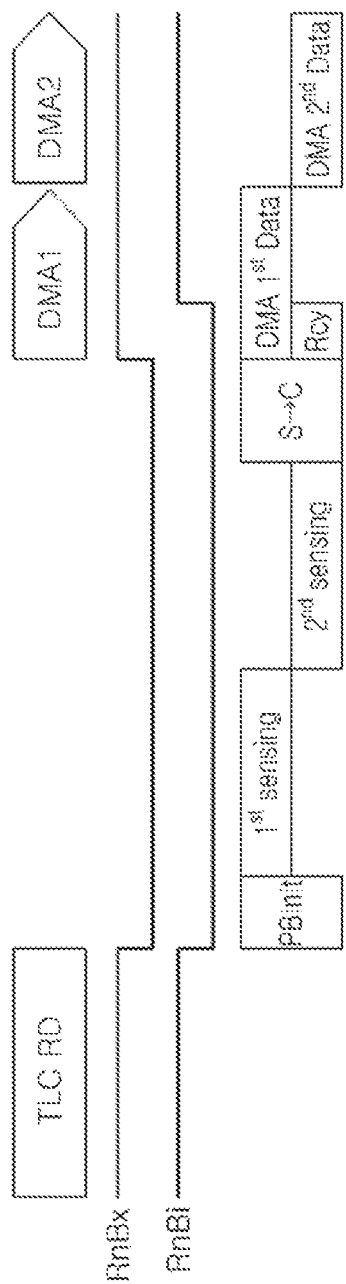

FIGS. 5A and 5B are views illustrating a heterogeneous multi-sensing operation according to an embodiment of the inventive concept.

Referring to FIG. 5A, a word line, requiring data read from a single word line as two read levels, may be set up as a first read level, and may then be sensed by first page buffers among page buffers, and sensed first pieces of sampling data may be stored in latches.

Thereafter, a word line may be set up as a second read level, and may then be sensed by second page buffers among the page buffers, and sensed second pieces of sampling data may be stored in latches.

In an embodiment, when outputting read data, the first pieces of sampling data read by a first sensing operation of the first read level may be first output, and the second pieces of sampling data read by a second sensing operation of the second read level may be continuously output through data output lines.

In an embodiment, a size of data stored in the page buffers may be 16 KB. A size of the page buffer of the inventive concept will not be limited thereto. In an embodiment, sizes of the first and second pieces of sampling data may be 8 KB. The sizes of the pieces of sampling data of the inventive concept will not be limited thereto.

As illustrated in FIG. 5A, after a page buffer initialization operation (PBInit) for the first sensing operation is performed, the first sensing operation ($1^{st}$ sensing) of a first read level may be performed. After a latch operation (S→C) for first pieces of sampling data according to the first sensing operation is performed, a recovery operation (Rcy) may be performed. In this case, the latch operation may include an operation of transmitting data of a sensing latch to a data latch. Then, a page buffer initialization (PBInit) operation for a second sensing operation according to a second read level may be performed. Thereafter, after a latch operation (S C) for second pieces of sampling data according to the second sensing operation ($2^{nd}$ sensing) is performed, a recovery operation (Rcy) may be performed.

In an embodiment, after the latch operation is completed, a ready & busy (RnB) signal RnB may be returned from a low level to a high level. In an embodiment, after the recovery operation, the RnB signal RnB may be internally returned from a low level to a high level.

In an embodiment, after the RnB signal RnB is returned from a low level to a high level, first pieces of sampling data of the first page buffer group may be output as first read level data (DMA1), and thereafter, second pieces of sampling data of the second page buffer group may be output as second read level data (DMA2).

FIG. 5A illustrates a heterogeneous multi-sensing operation implemented with two single-level cell (SLC) reads. The inventive concept may be implemented with a multi-level cell read.

FIG. 5B illustrates a heterogeneous multi-sensing operation to be implemented with a single triple level cell (TLC) read. Referring to FIG. 5B, the heterogeneous multi-sensing operation implemented by the TLC read may eliminate a latch operation (S→C) according to a first sensing operation ($1^{st}$ sensing), a recovery operation (Rcy), and a page buffer initialization (PBInit) for a second sensing operation ($2^{nd}$ sensing), as compared to that illustrated in FIG. 5A.

In general, as generations of NAND flash memories are developed for the next generation and cells are shrunk, cells may become vulnerable to deterioration, and performance and reliability may be lowered. To compensate therefor, the read level may be appropriately corrected according to a situation. A defensive code technique for analyzing a cell distribution by machine learning and determining a read level according to a shape of the analyzed distribution may be disclosed. Therefore, a number of additional read operations for identifying the cell distribution may be required. The non-volatile memory device according to the embodiment of FIG. 1 may use a heterogeneous multi-sensing technique to analyze a cell distribution more quickly.

In general, the defense code technique may be a method of selecting an optimal read level table for a current cell distribution among a plurality of pre-defined tables (PDTs). A general AI defense code technique may identify a cell distribution by performing two SLC read operations, and may then select an optimal read level. Latency may be longer, as compared to that of using a PDT according to the two SLC read operations. The inventive concept may perform a single read operation according to a heterogeneous multi-sensing operation to improve such a latency problem, to quickly provide an optimum read level in a single product without burden on a system.

A non-volatile memory device 100 according to an embodiment of the inventive concept may sample data on two or more read levels within a single ready & busy signal, and may output sampled data. For example, when data read on two read levels may be required to identify a threshold voltage distribution, a controller 200 may perform a heterogeneous multi-sensing operation in the non-volatile memory device 100, to perform a sensing operation in a first output unit (e.g., 8K), first pieces of sampling data of a first page buffer group may be extracted from a first DMA, and second pieces of sampling data of a second page buffer group may be extracted from a second DMA.

The heterogeneous multi-sensing operation illustrated in FIGS. 5A and 5B may include two sensing operations for a single word line. It may be understood that the heterogeneous multi-sensing operation of the inventive concept is not limited thereto. The heterogeneous multi-sensing operation of the inventive concept may store cell state information sampled in a plurality of page buffer groups, according to various combinations of at least one read level, at least one development time, at least one word line, and at least one block, in a single page buffer circuit 130.

For example, each of the page buffer groups of the page buffer circuit 130 may store pieces of sampling data according to various combinations by a heterogeneous multi-sensing operation, and may output the same, respectively. A non-volatile memory device 100 according to an embodiment of the inventive concept may output pieces of sampling data corresponding to different sensing conditions, not single user data, in single read busy and single page DMA.

Hereinafter, heterogeneous multi-sensing operations performed under various conditions will be described.

Figure 6A:
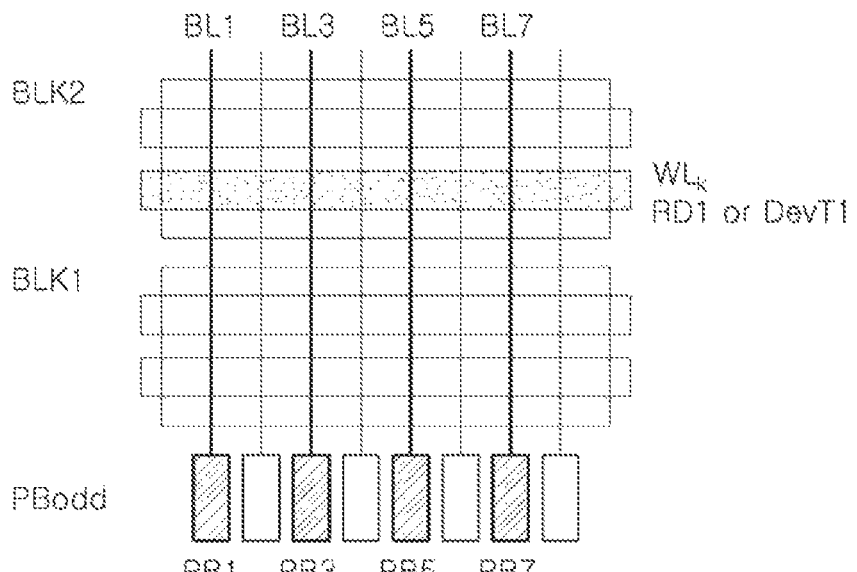
FIGS. 6A, 6B, and 6C are views illustrating a heterogeneous multi-sensing operation performed under conditions of different read levels RD1 and RD2 or different development times DevT1 and DevT2 on the same word line WLk in the same block BLK2.
Figure 6B:
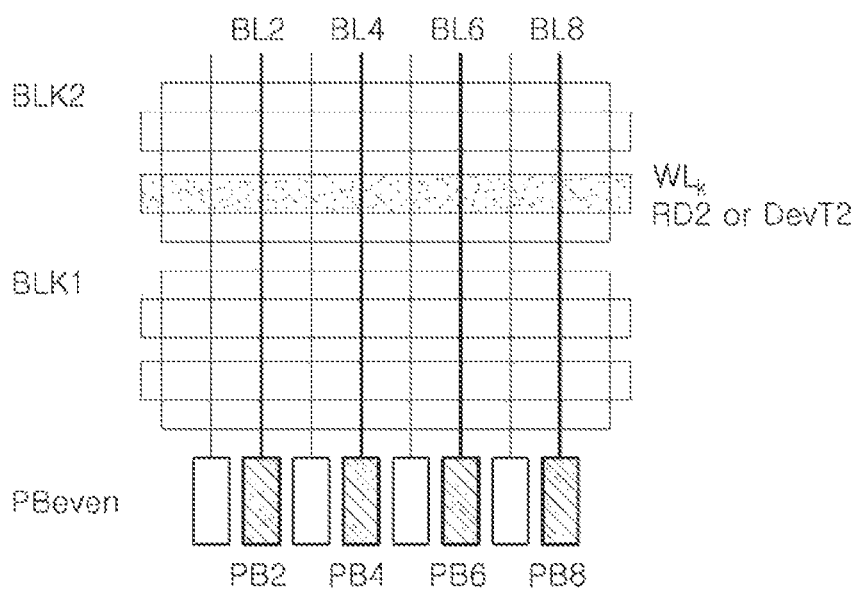
Figure 6C:
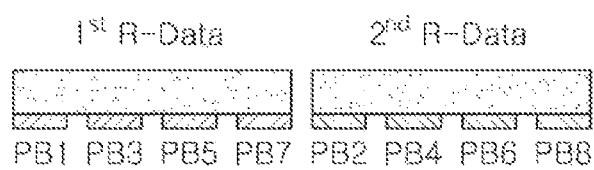

FIGS. 6A, 6B, and 6C are views illustrating a heterogeneous multi-sensing operation performed under conditions of different read levels RD1 and RD2 or different development times DevT1 and DevT2 on the same word line WLk in the same block BLK2.

As illustrated in FIG. 6A, a first sensing operation may be performed on a first read level RD1 or for a first development time DevT1 in bit lines BL1, BL3, BL5, and BL7 connected to odd-numbered page buffers PB1, PB3, PB5, and PB7 and in memory cells connected to a word line WLk in a second block BLK2.

As illustrated in FIG. 6B, a second sensing operation may be performed on a second read level RD2 or for a second development time DevT2 in bit lines BL2, BL4, BL6, and BL8 connected to even-numbered page buffers PB2, PB4, PB6, and PB8 and in memory cells connected to a word line WLk in a second block BLK2.

As illustrated in FIG. 6C, after a heterogeneous multi-sensing operation, first pieces of sampling data $1^{st}$ R-Data may be stored in the first page buffer groups PB1, PB3, PB5, and PB7, and second pieces of sampling data $2^{nd}$ R-Data may be stored in the second page buffer groups PB2, PB4, PB6, and PB8.

Figure 7A:
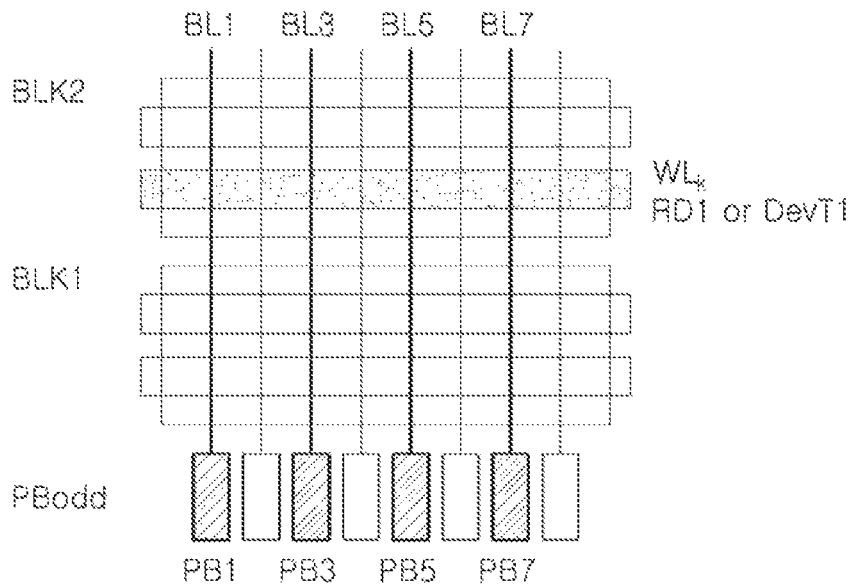
FIGS. 7A, 7B, and 7C are views illustrating a heterogeneous multi-sensing operation performed under conditions of different read levels RD1 and RD2 or different development times DevT1 and DevT2 on different word lines WLk and WLi in the same block BLK2.
Figure 7B:
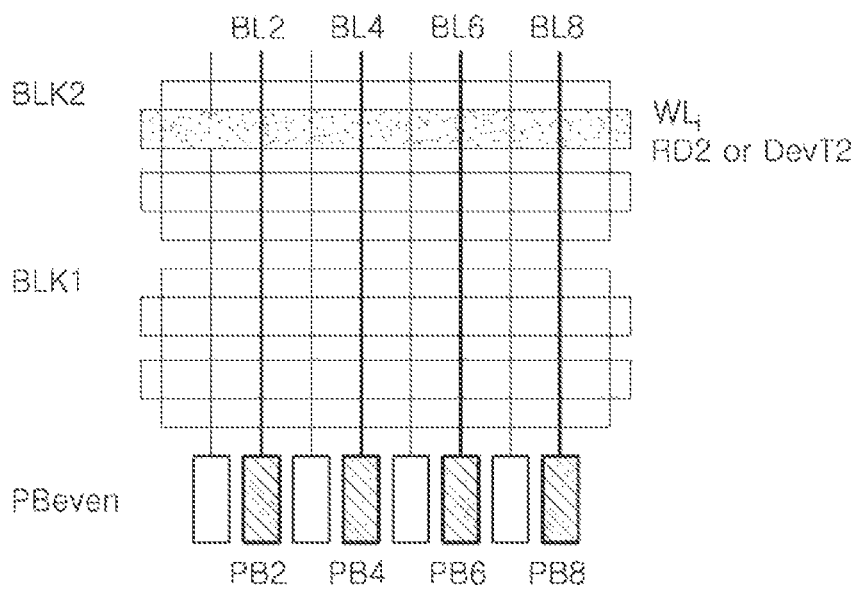
Figure 7C:
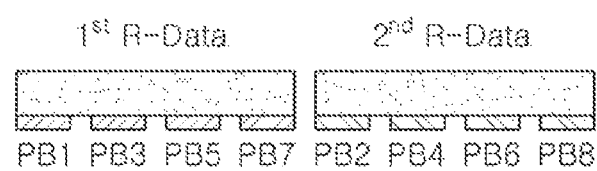

FIGS. 7A, 7B, and 7C are views illustrating a heterogeneous multi-sensing operation performed under conditions of different read levels RD1 and RD2 or different development times DevT1 and DevT2 on different word lines WLk and WLi in the same block BLK2.

Referring to FIGS. 7A, 7B, and 7C, in a heterogeneous multi-sensing operation, there is a difference that a second sensing operation may be performed by memory cells connected to a different word line WLi in the same block BL2, as compared to those illustrated in FIGS. 6A, 6B, and 6C.

Figure 8A:
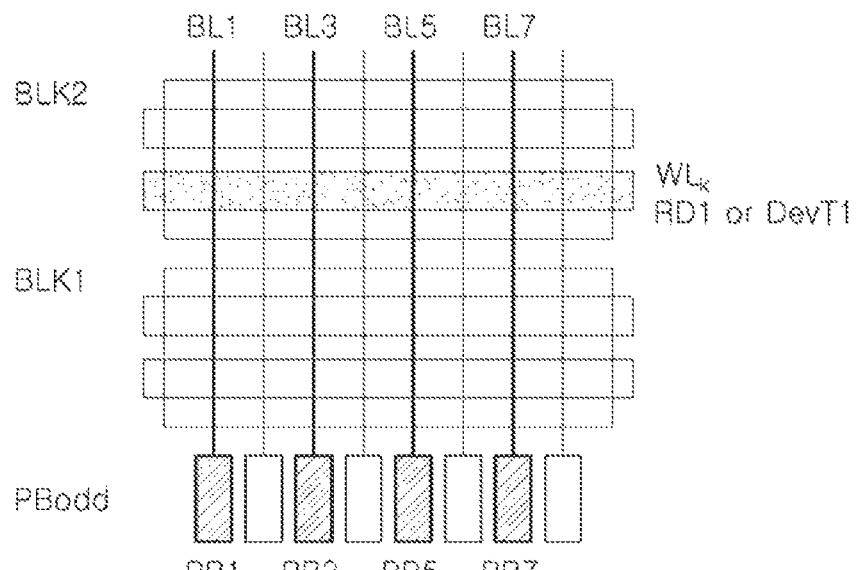
FIGS. 8A, 8B, and 8C are views illustrating a heterogeneous multi-sensing operation performed under conditions of the same read level RD1 or the same development time DevT1 on different word lines WLk and WLi in the same block BLK2.
Figure 8B:
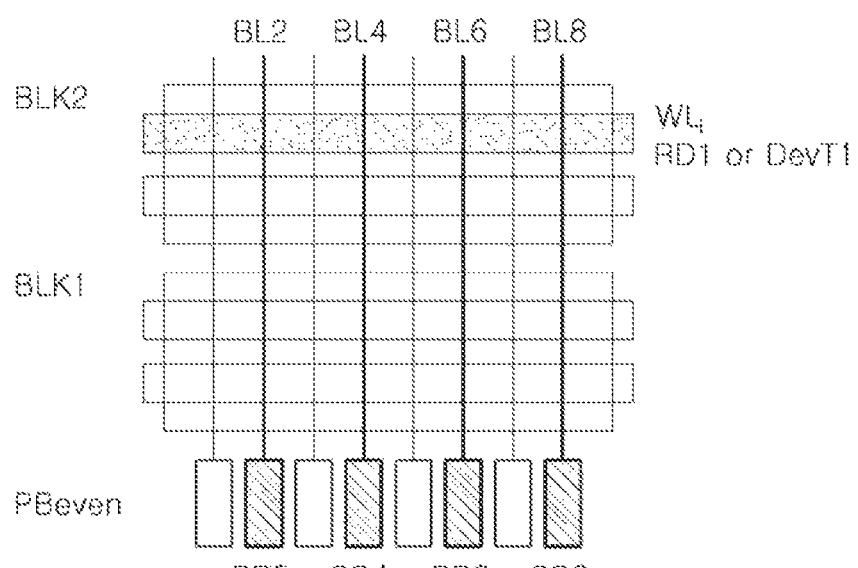
Figure 8C:
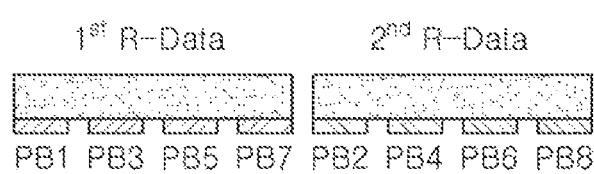

FIGS. 8A, 8B, and 8C are views illustrating a heterogeneous multi-sensing operation performed under conditions of the same read level RD1 or the same development time DevT1 on different word lines WLk and WLi in the same block BLK2.

Referring to FIGS. 8A, 8B, and 8C, in a heterogeneous multi-sensing operation, there is a difference that a second sensing operation may be performed in the same read level RD1 or the same development time, used in a first sensing operation, as compared to those illustrated in FIGS. 7A, 7B, and 7C.

Figure 9A:
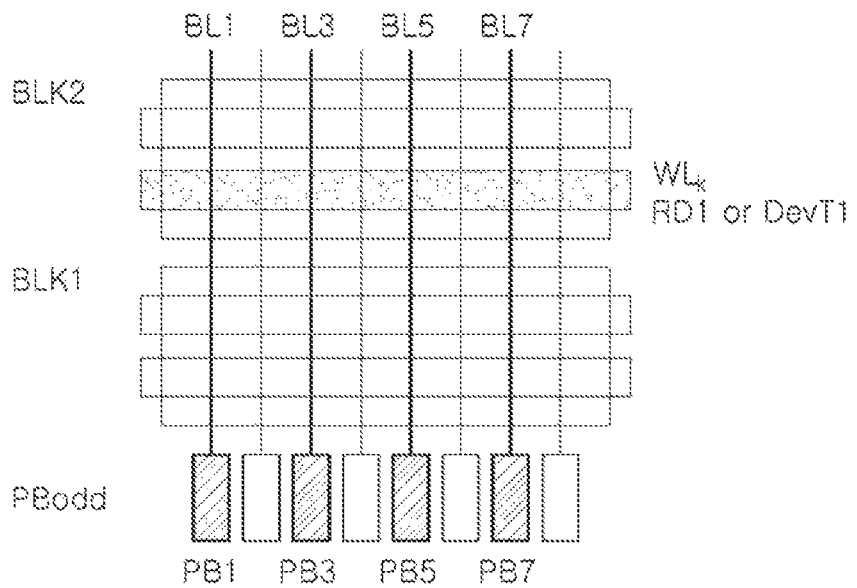
FIGS. 9A, 9B, and 9C are views illustrating a heterogeneous multi-sensing operation performed under conditions of different read levels RD1 and RD2 or different development times DevT1 and DevT2 on different word lines WLk and WLi in different blocks BLK1 and BLK2.
Figure 9B:
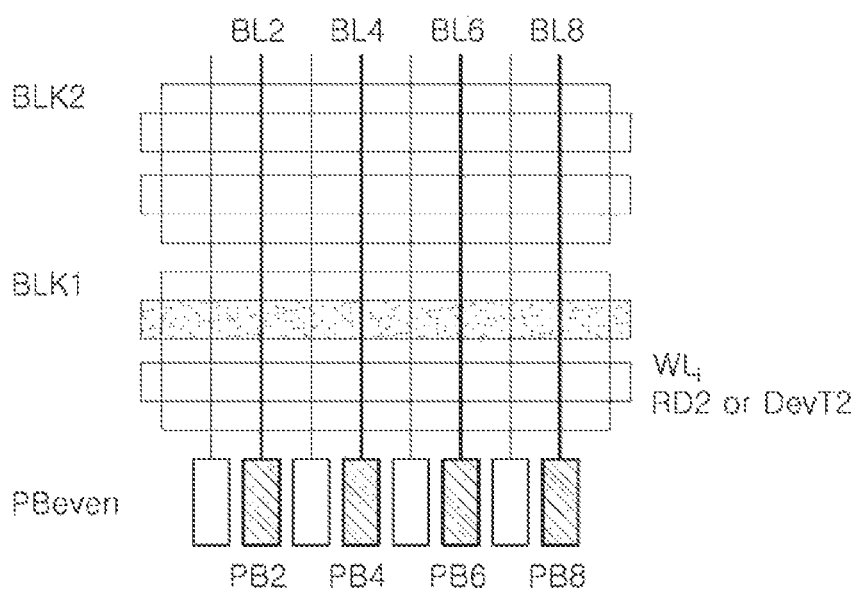
Figure 9C:
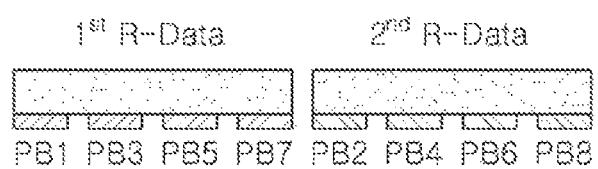

FIGS. 9A, 9B, and 9C are views illustrating a heterogeneous multi-sensing operation performed under conditions of different read levels RD1 and RD2 or different development times DevT1 and DevT2 on different word lines WLk and WLi in different blocks BLK1 and BLK2.

Referring to FIGS. 9A, 9B, and 9C, in a heterogeneous multi-sensing operation, there is a difference that a second sensing operation may be performed by memory cells connected to a different word line WLi in the first block BLK1, corresponding to a word line WLk of one block BLK2, as compared to those illustrated in FIGS. 7A, 7B, and 7C.

It may be understood that the heterogeneous multi-sensing operations described in FIGS. 6A to 9C are only illustrative. In a heterogeneous multi-sensing operation of the inventive concept, a plurality of sensing operations may be performed in a single read operation (a single command) under various sensing conditions.

Figure 10:
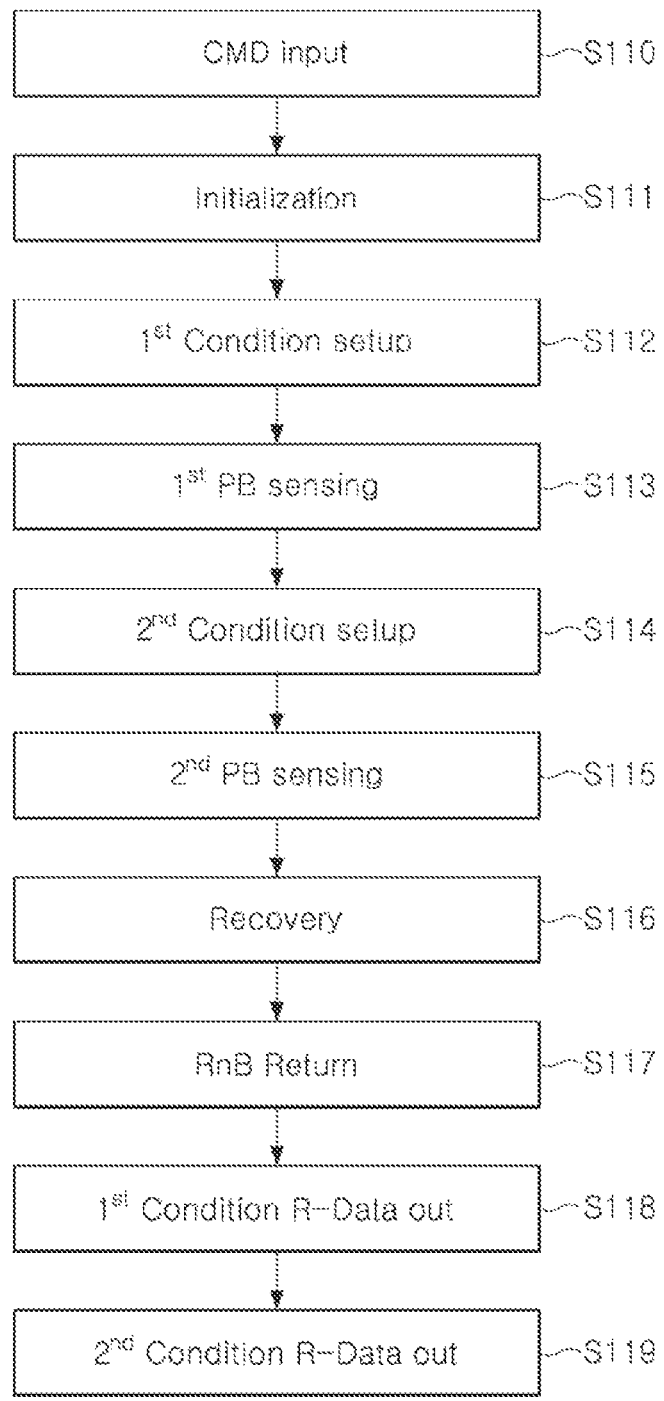
FIG. 10 is a flowchart illustrating a heterogeneous multi-sensing operation of anon-volatile memory device 100 according to an embodiment of the inventive concept.

FIG. 10 is a flowchart illustrating a heterogeneous multi-sensing operation of anon-volatile memory device 100 according to an embodiment of the inventive concept. Referring to FIGS. 1 to 10, a heterogeneous multi-sensing operation of a non-volatile memory device 100 may be performed as follows.

A health checkup command (HCCMD, see FIG. 1) for a heterogeneous multi-sensing operation may be received from a controller 200 (see FIG. 1) (S110). In this case, the health checkup command HCCMD may include position information for performing the heterogeneous multi-sensing operation. In an embodiment, position information for a first sensing operation may be identical to position information for a second sensing operation. In another embodiment, position information for the first sensing operation may be different from position information for the second sensing operation. Page buffers may be initialized in response to the health checkup command HCCMD (S111).

Thereafter, a first sensing condition for the first sensing operation may be set (S112). The first sensing operation corresponding to a first page buffer group may be performed based on the first sensing condition (S113). Thereafter, a second sensing condition for the second sensing operation may be set (S114). The second sensing operation corresponding to a second page buffer group may be performed based on the second sensing condition (S115). Then, a recovery operation may be performed (S116). After the recovery operation, an RnB signal may be returned to the controller 200 (S117).

Thereafter, first pieces of sampling data according to the first sensing condition may be output from the first page buffer group (S118), and second pieces of sampling data according to the second sensing condition may be output from the second page buffer group (S119).

A non-volatile memory device according to an embodiment of the inventive concept may output three or more pieces of sampling data in a heterogeneous multi-sensing operation.

Figure 11:
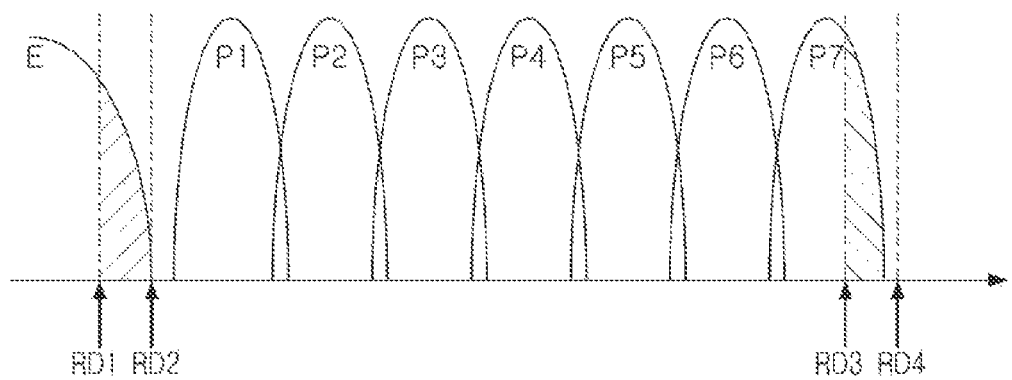
FIG. 11 is a view illustrating a read level used to identify a threshold voltage distribution in a non-volatile memory device 100 according to another embodiment of the inventive concept.

FIG. 11 is a view illustrating a read level used to identify a threshold voltage distribution in a non-volatile memory device 100 according to another embodiment of the inventive concept.

Referring to FIG. 11, to identify a threshold voltage distribution, first and second read levels corresponding to an erase state E may be used, and third and fourth read levels corresponding to the highest state P7 may be used.

Figure 12A:
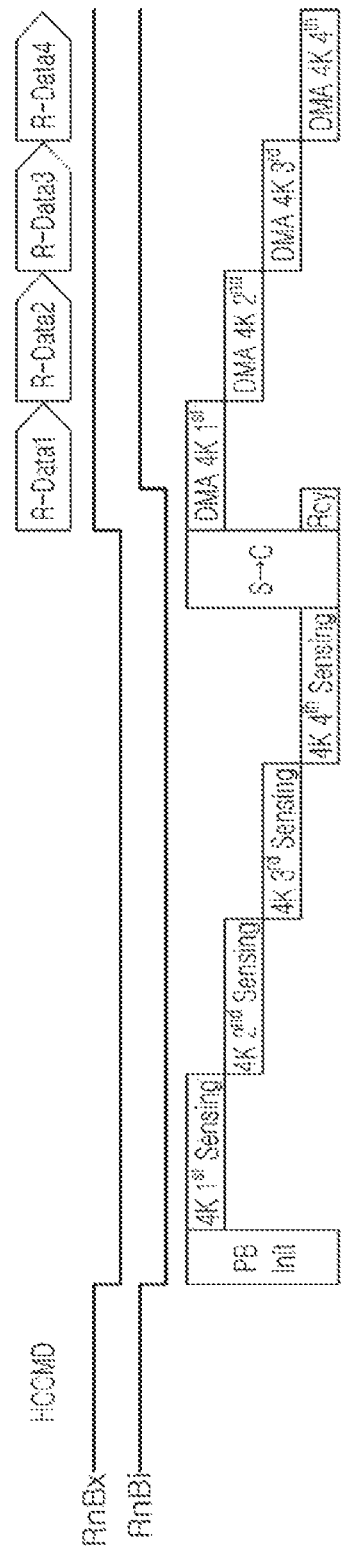
FIGS. 12A and 12B are views illustrating a heterogeneous multi-sensing operation composed of four sensing operations.
Figure 12B:
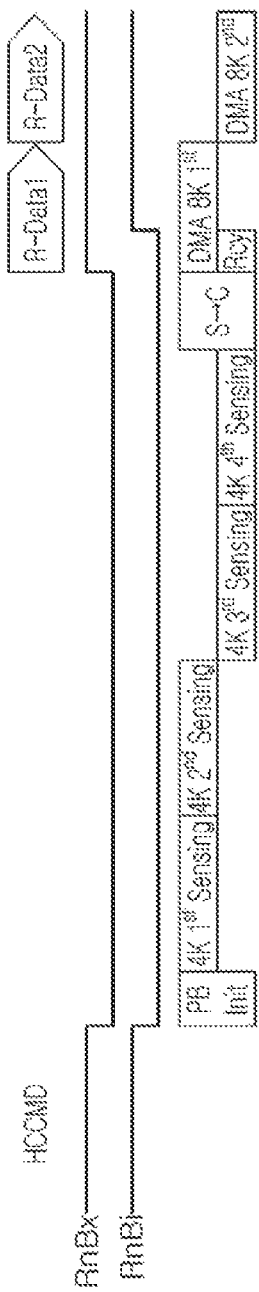

FIGS. 12A and 12B are views illustrating a heterogeneous multi-sensing operation composed of four sensing operations.

Referring to FIG. 12A, four (4) sensing operations according to different sensing conditions may be performed in response to a health checkup command HCCMD, and pieces of sampling data according to each of the sensing operations may be output.

Referring to FIG. 12B, four (4) sensing operations according to different sensing conditions may be performed in response to a health checkup command HCCMD, and calculated values for pieces of sampling data may be stored in the four (4) sensing operations. In an embodiment, result values according to first and second sensing operations may be calculated and stored in a first page buffer group, and result values according to third and fourth sensing operations may be calculated and stored in a second page buffer group.

Thereafter, calculated data stored in the first page buffer group and calculated data stored in the second page buffer group may be output as cell state information having a single page size corresponding to the health checkup command HCCMD.

A storage device 10 according to an embodiment of the inventive concept may optimize read level using the cell state information.

Figure 13A:
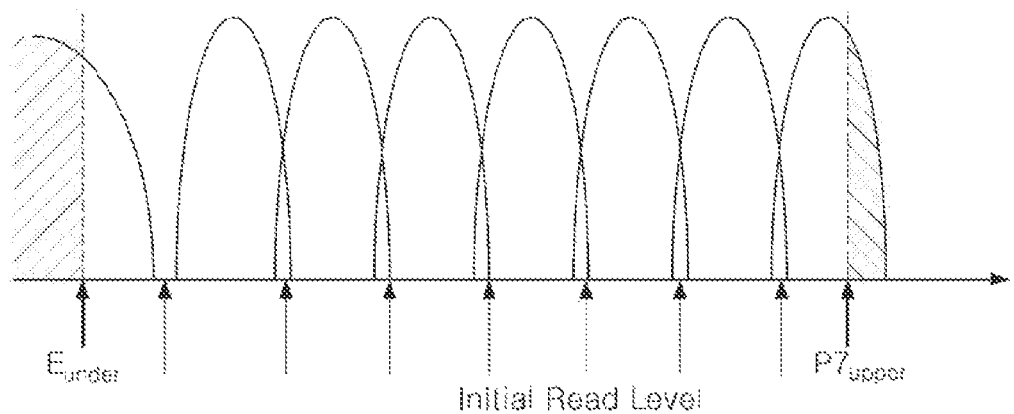
FIGS. 13A and 13B are views illustrating an example of using cell state information to correct a read level.
Figure 13B:
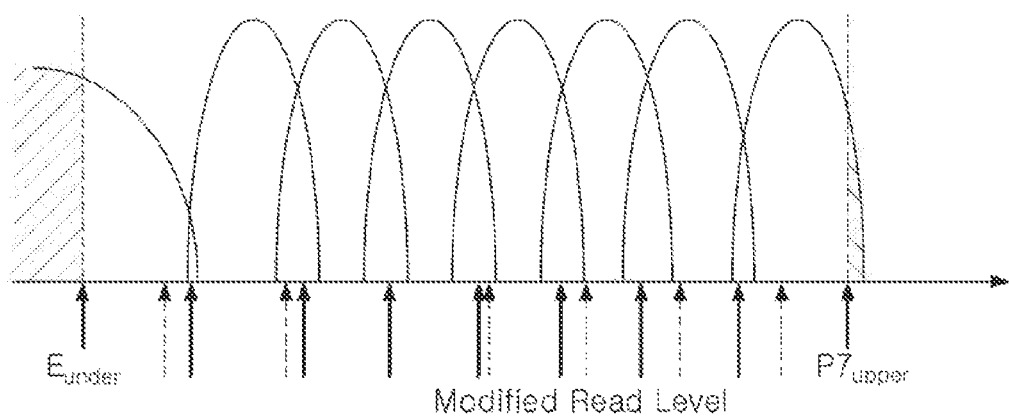

FIGS. 13A and 13B are views illustrating an example of using cell state information to correct a read level. As illustrated in FIG. 13A, cell state information below a first read level in an erase state E and cell state information above a second read level in the highest program state P7 may be output by a heterogeneous multi-sensing operation of a non-volatile memory device 100. In an embodiment, the cell state information may include count information corresponding to threshold voltage distributions.

A controller 200 (refer to FIG. 1) may using the cell state information received from the non-volatile memory device 100 to identify distribution deterioration characteristics of memory cells and change an existing read level to an optimum read level.

A storage device 10 according to an embodiment of the inventive concept may use cell state information of memory cells connected to a word line WLi−1, adjacent to a selected word line WLi, to perform a reclaim.

Figure 14:
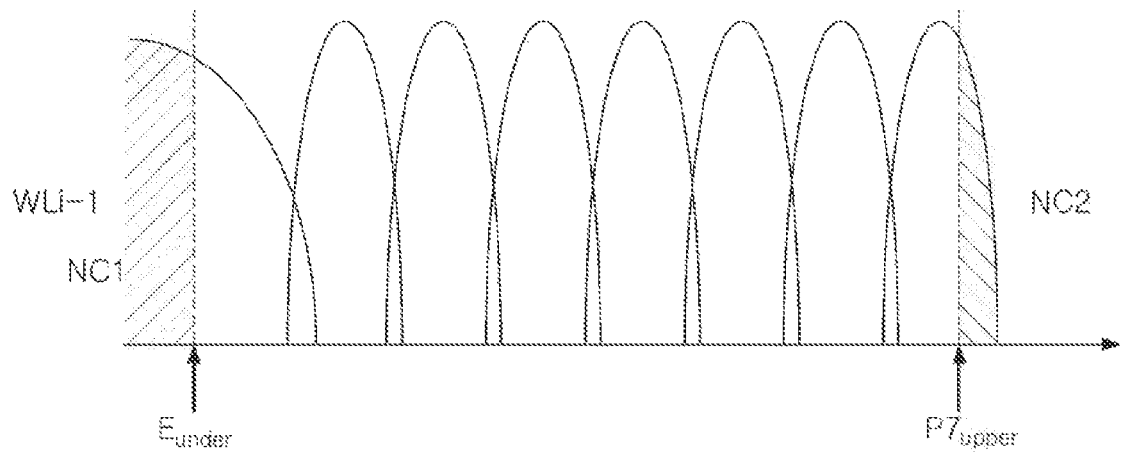
FIG. 14 is a view illustrating an example of using a distribution characteristic of memory cells connected to an adjacent word line WLi−1 according to an embodiment of the inventive concept, to determine whether or not a reclaim may be performed.

FIG. 14 is a view illustrating an example of using a distribution characteristic of memory cells connected to an adjacent word line WLi−1 according to an embodiment of the inventive concept, to determine whether or not a reclaim is performed. As illustrated in FIG. 14, when a first cell count value NC1 below a first read level $E_{under}$ is lower than a first reference value, or a second cell count value NC2 above a second read level $P7_{upper}$ upper is lower than a second reference value, it may be determined that a degree of deterioration is severe. In this case, data for memory cells connected to a selected word line WLi may be reclaimed to memory cells connected to another word line.

A storage device 10 according to an embodiment of the inventive concept may use cell state information of memory cells connected to a word line WLi+1, adjacent to the selected word line WLi, to determine whether the adjacent word line is open.

Figure 15:
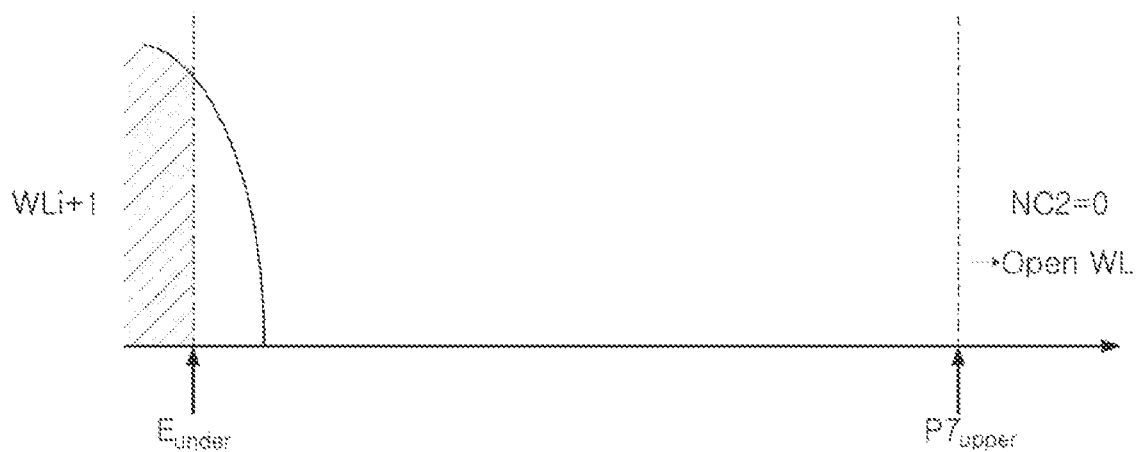
FIG. 15 is a view illustrating an example of using a distribution characteristic of memory cells connected to an adjacent word line WLi+1 according to an embodiment of the inventive concept, to determine whether the adjacent word line WLi+1 is open.

FIG. 15 is a view illustrating an example of using a distribution characteristic of memory cells connected to an adjacent word line WLi+1 according to an embodiment of the inventive concept, to determine whether the adjacent word line WLi+1 is open. As illustrated in FIG. 15, when a cell count value NC2 of a read level $P7_{upper}$ or higher, corresponding to the highest program state P7, is zero (0), an adjacent word line WLi+1 may be determined as an open word line.

Figure 16A:
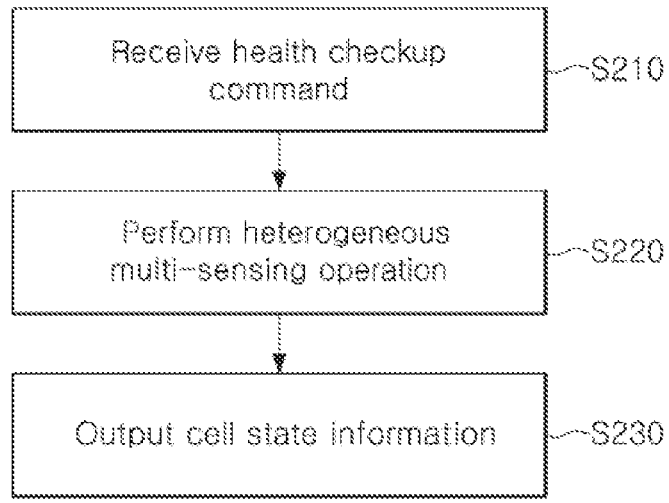
FIG. 16A is a flowchart illustrating a method of operating a non-volatile memory device 100 according to an embodiment of the inventive concept.

FIG. 16A is a flowchart illustrating a method of operating a non-volatile memory device 100 according to an embodiment of the inventive concept. Referring to FIGS. 1 to 16A, operations of a non-volatile memory device 100 may be performed as follows.

A storage device 10 may perform an operation of improving reliability of data in response to an external request or an internal request. To this end, the storage device 10 may first identify a state of a threshold voltage distribution of a memory cell. A controller 200 may issue a health checkup command HCCMD and transmit the same to the non-volatile memory device 100. The non-volatile memory device 100 may periodically or aperiodically receive the health checkup command HCCMD from the controller 200 (S210).

The non-volatile memory device 100 may perform a heterogeneous multi-sensing operation in response to the health checkup command HCCMD (S220). In this case, pieces of sampling data corresponding to the threshold voltage distribution according to the heterogeneous multi-sensing operation may be stored in each page buffer groups.

Thereafter, the pieces of sampling data stored in each of the page buffer groups may be output to the controller 200 as cell state information corresponding to the health checkup command HCCMD (S230).

The pieces of sampling data of heterogeneous multi-sensing operations according to an embodiment of the inventive concept may be also calculated and output.

Figure 16B:
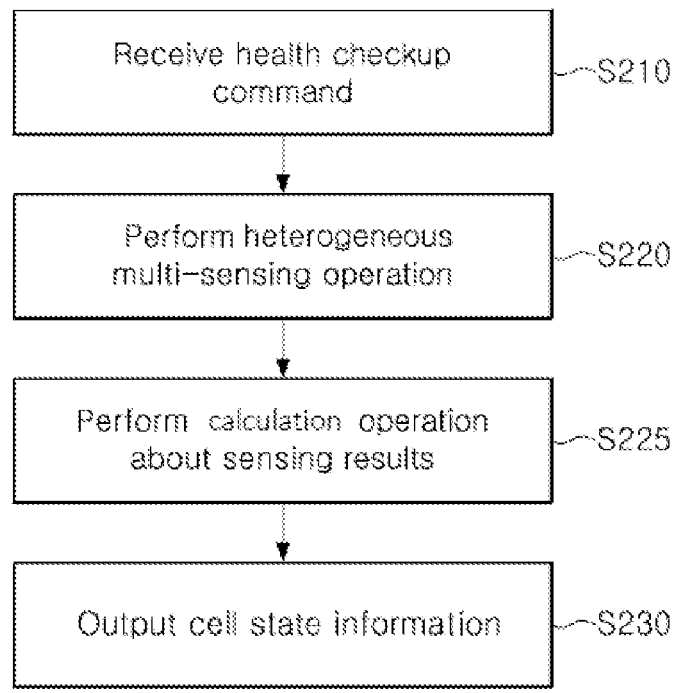
FIG. 16B is a flowchart illustrating a method of operating a non-volatile memory device 100 according to another embodiment of the inventive concept.

FIG. 16B is a flowchart illustrating a method of operating a non-volatile memory device 100 according to another embodiment of the inventive concept. Referring to FIGS. 1 to 16B, operations of a non-volatile memory device 100 may further include calculating sensing result values, as compared to that of FIG. 16A (S225). The calculated result values may be stored in page buffer groups, and data stored in the page buffer groups may be output to a controller 200 as cell state information.

Figure 17:
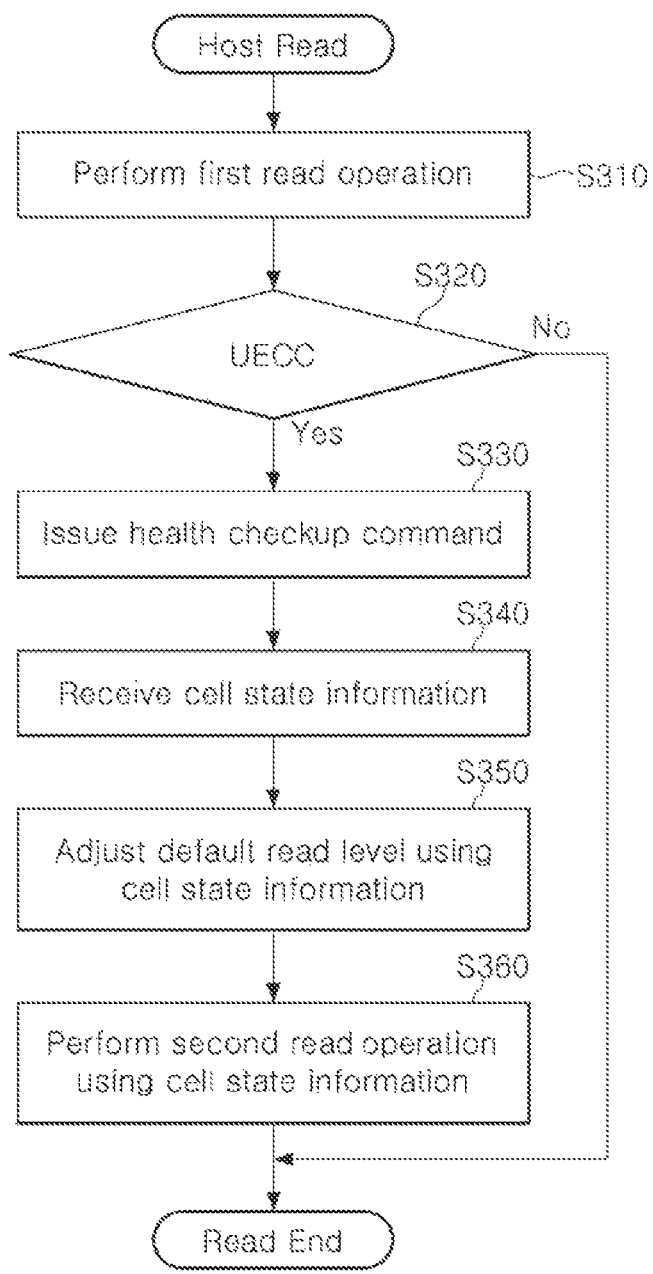
FIG. 17 is a flowchart illustrating a method of reading a storage device 10 according to an embodiment of the inventive concept.

FIG. 17 is a flowchart illustrating a method of reading a storage device 10 according to an embodiment of the inventive concept. Referring to FIGS. 1 to 17, a read operation of a storage device 10 may be performed as follows.

In response to a read command transmitted from a controller 200 (see FIG. 1), a non-volatile memory device 100 (FIG. 1) may use a default read voltage level to perform a first read operation (S310). In this case, information corresponding to the default read voltage level may be transmitted from the controller 200, together with the read command.

The controller 200 may determine whether uncorrectable error correction code (UECC) occurs, as a result of the first read operation (S320). When the UECC has not occurred, the read operation may be completed. When the UECC has occurred, the non-volatile memory device 100 may perform a heterogeneous multi-sensing operation in response to a health checkup command HCCMD transmitted from the controller 200 (S330). The controller 200 may receive cell state information according to the heterogeneous multi-sensing operation from the non-volatile memory device 100 (S340). The controller 200 may use the received cell state information to adjust a default read level to an optimal default read level (S350). Thereafter, the controller 200 may transmit a read command using the optimal default read level to the non-volatile memory device 100. Thereafter, the non-volatile memory device 100 may use the optimal default read level to perform a second read operation (S360).

In an embodiment, the non-volatile memory device 100 may output pieces of sampling data corresponding to a word line position or a bit line position to the controller, according to a plurality of sensing operations for at least two threshold voltage distributions.

In an embodiment, the non-volatile memory device 100 may sample data corresponding to the at least two threshold voltage distributions on at least two read levels within a single read busy signal, and may output the sampled data.

In an embodiment, the controller 200 may use machine learning to issue a health checkup command, and may output the issued health checkup command to the non-volatile memory device 100.

Figure 18:
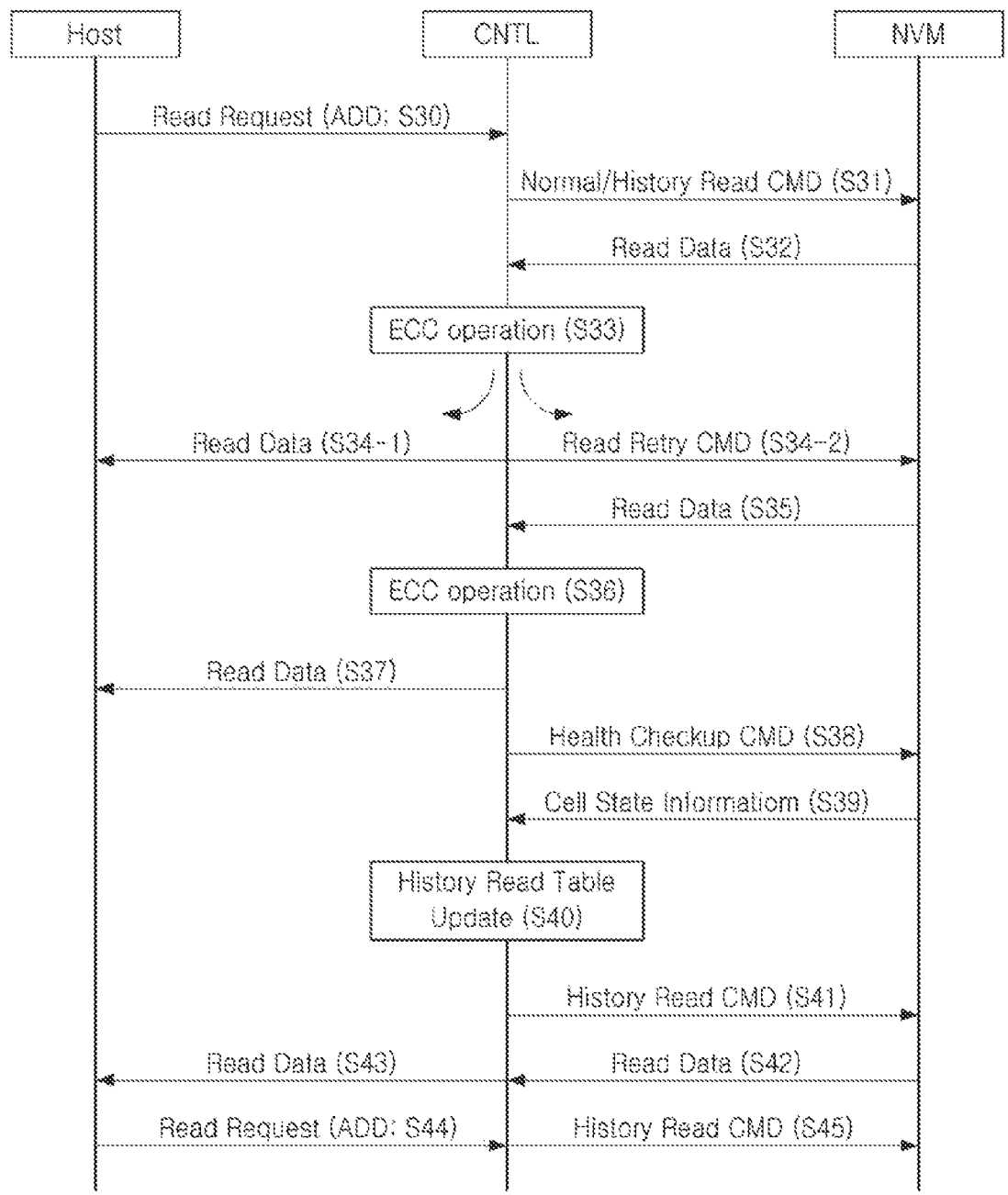
FIG. 18 is a ladder diagram illustrating a process of compensating for an optimum read level in a storage device 10 according to an embodiment of the inventive concept.

FIG. 18 is a ladder diagram illustrating a process of compensating for an optimum read level in a storage device 10 according to an embodiment of the inventive concept. Referring to FIGS. 1 to 18, a read operation of a storage device 10 may be performed as follows.

A read request for the storage device 10 may be received from a host (S30). A controller CNTL may issue a normal or history read command corresponding to the read request, and may transmit the normal or history read command to a non-volatile memory device NVM (S31). In this case, the normal or history read command may include a default read level. In an embodiment, in a history read operation, a default read voltage level may be determined using read voltage level offset information of a history read table.

Thereafter, the non-volatile memory device NVM may use the default read level in response to the normal/history read command, to perform a read operation. Read data according to the read operation may be output to the controller CNTL (S32).

Thereafter, the controller CNTL may determine whether the read data received from the non-volatile memory device NVM passes an error correction circuit ECC (S33). When the error correction circuit ECC passes, the read data may be transmitted to the host to complete the read operation (S34-1). When the error correction circuit ECC does not pass, the controller CNTL may issue a read retry command for the non-volatile memory device NVM, and may transmit the read retry command to the non-volatile memory device NVM (S34-2). The non-volatile memory device NVM may perform a read operation in a predetermined manner (e.g., an on-chip valley search method) in response to the read retry command. Thereafter, read data corresponding to the read retry command may be output to the controller CNTL (S35).

Thereafter, the controller CNTL may determine again whether the read data received from the non-volatile memory device NVM passes the error correction circuit ECC (S36). When there is no error or an error correction is possible, the read data may be output to the host (S37), and the read operation may be completed.

When the error correction circuit ECC is passed again, the controller CNTL may issue a health checkup command HCCMD, and may transmit the issued health checkup command HCCMD to the non-volatile memory device NVM (S38). The non-volatile memory device NVM may perform a heterogeneous multi-sensing operation in response to the health checkup command HCCMD, and may output cell state information corresponding to performed results to the controller CNTL (S39).

The controller CNTL may use the cell state information to update the history read table (S40). For example, the controller CNTL may use the cell state information to optimally correct the default read level.

Thereafter, the controller CNTL may issue a history read command on the corrected history read level, and may transmit the issued history read command to the non-volatile memory device NVM (S41).

Thereafter, the non-volatile memory device NVM may use the corrected default read level in response to the history read command. Read data according to this read operation may be output to the controller CNTL (S42). Thereafter, the read data may be output to the host (S43).

Thereafter, when a new read request for the same position is received from the host (S44), a history read command having a changed default read level may be transmitted to the non-volatile memory device NVM (S45). Thereafter, the read operation of the non-volatile memory device NVM will proceed as described above.

A health checkup operation for the non-volatile memory device according to an embodiment of the inventive concept may be performed by a separate processor for artificial intelligence.

Figure 19:
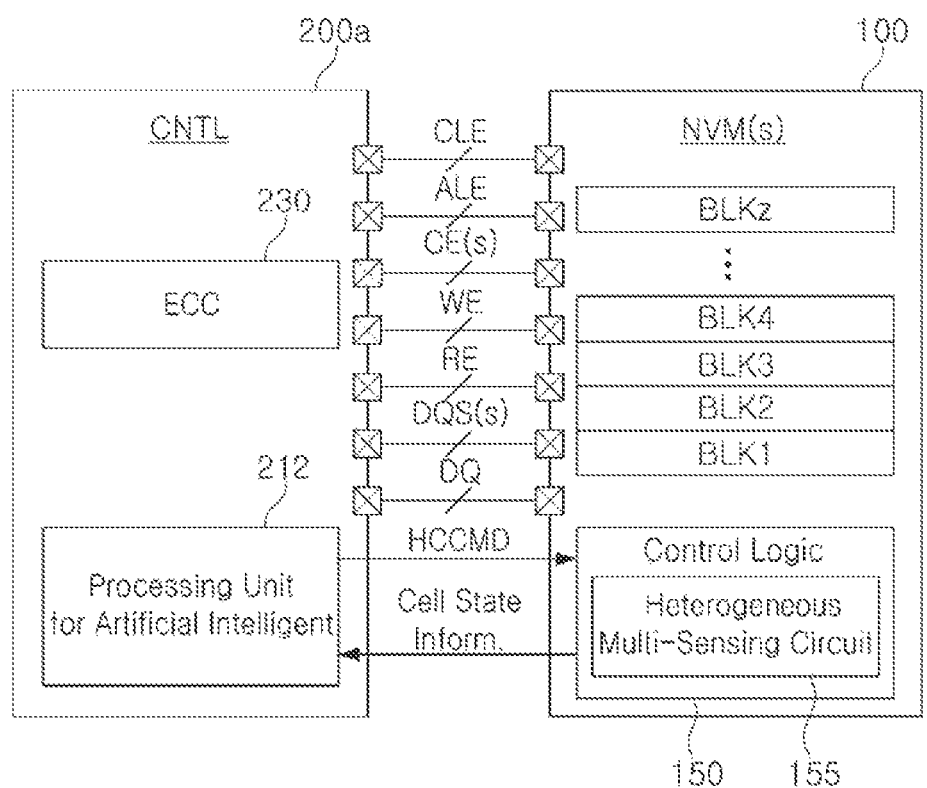
FIG. 19 is a view illustrating a storage device 20 according to another embodiment of the inventive concept.

FIG. 19 is a view illustrating a storage device 20 according to another embodiment of the inventive concept. Referring to FIG. 19, a storage device 20 may include at least one non-volatile memory device 100 and a controller 200a controlling the same.

The controller CNTL 200a may be connected to the at least one non-volatile memory device 100 by a plurality of control pins transmitting control signals (e.g., a CLE signal, an ALE signal, a CE(s) signal, a WE signal, a RE signal, and the like). In addition, the control signals (e.g., a CLE signal, an ALE signal, a CE(s) signal, a WE signal, a RE signal, and the like) may be implemented to be used to control the non-volatile memory device 100. For example, the non-volatile memory device 100 may latch a command or an address at an edge of a write enable (WE) signal according to a command latch enable (CLE) signal and an address latch enable (ALE) signal, to perform a program operation/read operation/erase operation.

The controller 200a may be implemented to control an overall operation of the storage device 20. The controller 200a may perform various management operations such as a cache/buffer management, a firmware management, a garbage collection management, a wear leveling management, a data duplication removal management, a read refresh/reclaim management, a bad block management, a multi-stream management, a mapping management of host data and non-volatile memory, a quality of service (QoS) management, a system resource allocation management, a non-volatile memory queue management, a read voltage level management, an erase/program management, a hot/cold data management, a power loss protection management, a dynamic thermal management, an initialization management, a redundant array of inexpensive disk (RAID) management, or the like.

In addition, the controller 200a may include an artificial intelligence processor 212 and an error correction circuit 230. The artificial intelligence processor 212 may be implemented to use artificial intelligence, to perform the health checkup operation described in FIGS. 1 to 18, and perform an optimal operation according to results.

The ECC circuit 230 may be implemented to generate an error correction code during a program operation, and use the error correction code during a read operation to recover data DATA. For example, the ECC circuit 230 may generate an error correction code (ECC) for correcting a fail bit or an error bit of data DATA received from the non-volatile memory device 100. The ECC circuit 230 may perform error correction encoding of data provided to the non-volatile memory device 100, to form data DATA to which a parity bit is added. The parity bit may be stored in the non-volatile memory device 100. In addition, the ECC circuit 230 may perform error correction decoding on the data DATA output from the non-volatile memory device 100. The ECC circuit 230 may correct an error using the parity bit. The ECC circuit 230 may correct an error using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), or the like.

A non-volatile memory device according to an embodiment of the inventive concept may be implemented to have a chip-to-chip (C2C) structure.

Figure 20:
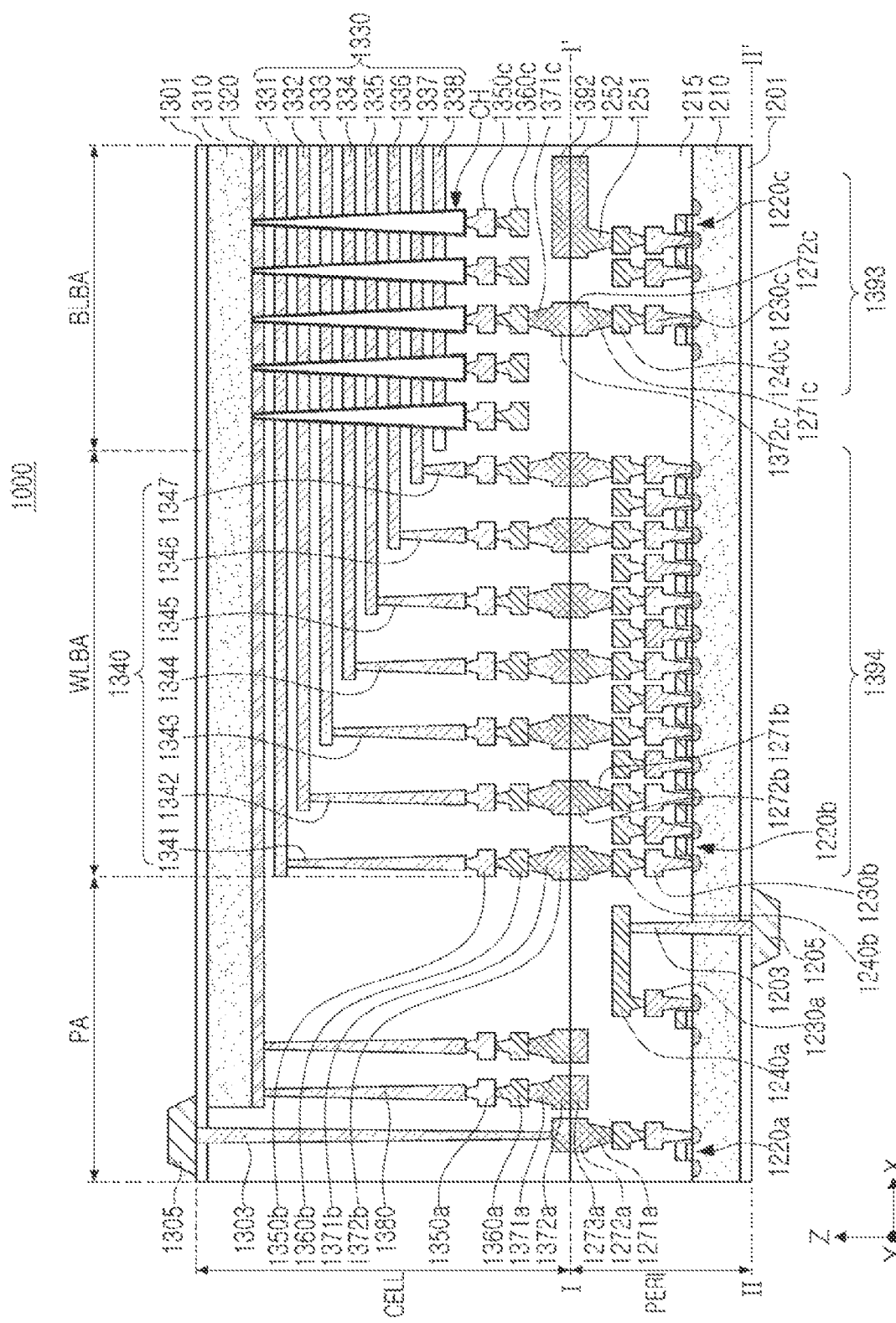
FIG. 20 is a view illustrating a non-volatile memory device 1000 implemented as a C2C structure according to an embodiment of the inventive concept.

FIG. 20 illustrates a nonvolatile memory device 1000 implemented in a C2C structure according to an example embodiment.

The C2C structure may mean that an upper chip including a cell region CELL is manufactured on a first wafer and a lower chip including a peripheral circuit region PERI is manufactured on a second wafer, separate from the first wafer, and then bonding the upper chip and the lower chip to each other. Here, the bonding process may be a method of electrically connecting a bonding metal, formed on an uppermost metal layer of an upper chip, and a bonding metal, formed on an uppermost metal layer of a lower chip, to each other. In an example embodiment, when a bonding metal is include copper (Cu) using, a Cu-to-Cu bonding. In example embodiment, however, may not be limited thereto. For example, the bonding metal may be formed of aluminum (Al) or tungsten (W).

Each of the peripheral circuit region PERI and the cell region CELL of the nonvolatile memory device 1000 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c disposed on the first substrate 1210, first metal layers 1230a, 1230b, and 1230c, respectively connected the plurality of circuit elements 1220a, 1220b, and 1220c, and second metal layers 1240a, 1240b, and 1240c disposed on the first metal layers 1230a, 1230b, and 1230c. In an example embodiment, the first metal layers 1230a, 1230b, and 1230c may be formed of tungsten (W) having relatively high electrical resistance. In an example embodiment, the second metal layers 1240a, 1240b, and 1240c may be formed of copper (Cu) having relatively low electrical resistance.

In FIG. 20, the first metal layers 1230a, 1230b, and 1230c and the second metal layers 1240a, 1240b, and 1240c are illustrated, but the disclosure is not limited thereto. One or more additional metal layers may be further provided on the metal layers 1240a, 1240b, and 1240c. At least some of the one or more additional metal layers, provided on the second metal layers 1240a, 1240b, and 1240c, may be formed of aluminum (Al), or the like, having lower electrical resistance than copper (Cu) forming the second metal layers 1240a, 1240b, and 1240c.

In an example embodiment, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an example embodiment, the interlayer insulating layer 1215 may include an insulating material such as a silicon oxide, a silicon nitride, or the like.

Lower bonding metals 1271b and 1272b may be provided on the second metal layer 1240b in the word line bonding region WLBA. In the word line bonding area WLBA, the lower bonding metals 1271b and 1272b of the peripheral circuit region PERI may be electrically bonded to the upper bonding metals 1371b and 1372b of the cell region CELL using a bonding method. In an example embodiment, the lower bonding metals 1271b and 1272b and upper bonding metals 1371b and 1372b may be formed of aluminum (Al), copper (Cu), tungsten (W), or the like. Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. In an example embodiment, the cell region CELL may include a second substrate 1310 and a common source line 1320. A plurality of word lines 1331 to 1338 (collectively, 1330) may be stacked on the second substrate 1310 in a direction, perpendicular to an upper surface of the second substrate 1310, (a Z-axis direction). In an example embodiment, string select lines and a ground select line may be disposed above and below the word lines 1330, respectively. In an example embodiment, a plurality of word lines 1330 may be disposed between the string select lines and the ground select line.

In the bit line bonding area BLBA, a channel structure CH may extend in a direction (a Z-axis direction), perpendicular to the upper surface of the second substrate 1310, to penetrate through the word lines 1330, the string select lines, and the ground select line. The channel structure CH may include a data storage layer, a channel layer, a buried insulating layer, and the like. The channel layer may be electrically connected to the first metal layer 1350c and the second metal layer 1360c. For example, the first metal layer 1350c may be a bit line contact and the second metal layer 1360c may be a bit line. In an example embodiment, the bit line 1360c may extend in a first direction (a Y-axis direction), parallel to the upper surface of the second substrate 1310.

As illustrated in FIG. 20, an area in which the channel structure CH and the bit line 1360c are disposed may be defined as the bit line bonding area BLBA. In an example embodiment, in the bit line bonding area BLBA, the bit line 1360c may be electrically connected to circuit elements 1220c providing the page buffer 1393 in the peripheral circuit region PERI. The bit line 1360c may be connected to upper bonding metals 1371c and 1372c in the peripheral circuit region PERI. The upper bonding metals 1371c and 1372c may be connected to lower bonding metals 1271c and 1272c connected to the circuit elements 1220c of the page buffer 1393.

In the word line bonding area WLBA, the word lines 1330 may extend in a second direction (an X-axis direction), parallel to the upper surface of the second substrate 1310 and perpendicular to the first direction. In an example embodiment, the word line bonding area WLBA may be connected to the plurality of cell contact plugs 1341 to 1347 (collectively, 1340). For example, the word lines 1330 and the cell contact plugs 1340 may be connected to each other on pads, in which at least some of the word lines 1330 are provided to extend in different lengths, in the second direction. In an example embodiment, the first metal layer 1350b and the second metal layer 1360b may be sequentially connected to upper portions of cell contact plugs 1340 connected to the word lines 1330. In an example embodiment, in the wordline bonding area WLBA, the cell contact plugs 1340 may be connected to the peripheral circuit region PERI through the upper bonding metals 1371b and 1372b in the cell region CELL and the lower bonding metals 1271b and 1272b in the peripheral circuit region PERI.

In an example embodiment, the cell contact plugs 1340 may be electrically connected to circuit elements 1220b forming a row decoder 1394 in the peripheral circuit region PERI. In an example embodiment, an operating voltage of the circuit elements 1220b, forming the row decoder 1394, may be different from an operating voltage of the circuit elements 1220c forming the page buffer 1393. For example, the operating voltage of the circuit elements 1220c, forming the page buffer 1393, may be higher than the operating voltages of the circuit elements 1220b forming the row decoder 1394.

A common source line contact plug 1380 may be disposed in the external pad bonding area PA. In an example embodiment, the common source line contact plug 1380 may be formed of a conductive material such as a metal, a metal compound, polysilicon, or the like. The common source line contact plug 1380 may be electrically connected to the common source line 1320. A first metal layer 1350a and a second metal layer 1360a may be sequentially stacked on the common source line contact plug 1380. For example, an area in which the common source line contact plug 1380, the first metal layer 1350a, and the second metal layer 1360a are disposed may be defined as an external pad bonding area PA.

Input/output pads 1205 and 1305 may be disposed in the external pad bonding area PA. Referring to FIG. 20, a lower insulating layer 1201 may be provided below the first substrate 1210 to cover a lower surface of the first substrate 1210. A first input/output pad 1205 may be provided on the lower insulating layer 1201. In an example embodiment, the first input/output pad 1205 may be connected to any one or any combination of the plurality of circuit elements 1220a, 1220b, and 1220c, disposed in the peripheral circuit region PERI, through the first input/output contact plug 1203. In an example embodiment, the first input/output pad 1205 may be separated from the first substrate 1210 by the lower insulating layer 1201. In addition, a side insulating layer may be disposed between the first input/output contact plug 1203 and the first substrate 1210 to electrically separate the first input/output contact plug 1203 and the first substrate 1210 from each other. In the example embodiment, the second input-output pad 1305 is electrically connected to a circuit element 1220a.

Referring to FIG. 20, an upper insulating layer 1301 may be provided on the second substrate 1310 to cover the upper surface of the second substrate 1310. A second input/output pad 1305 may be disposed on the upper insulating layer 1301. In an example embodiment, the second input/output pad 1305 may be connected to any one or any combination of the plurality of circuit elements 1220a, 1220b, and 1220c, disposed in the peripheral circuit region PERI, through the second input/output contact plug 1303.

In an example embodiment, the second substrate 1310, the common source line 1320, and the like, may not be disposed in a region in which the second input/output contact plug 1303 is disposed. The second input/output pad 1305 may not overlap the word lines 1330 in the third direction (the Z-axis direction). Referring to FIG. 20, the second input/output contact plug 1303 may be separated from the second substrate 1310 in a direction, parallel to the upper surface of the second substrate 1310. Also the second input/output contact plug 1303 may be connected to the second input/output pad 1305 through the interlayer insulating layer 1315 in the cell region CELL.

In an example embodiment, the first input/output pad 1205 and the second input/output pad 1305 may be selectively provided. For example, the nonvolatile memory device 1000 may include only the first input/output pad 1205, provided on the first substrate 1210, or only the second input/output pad 1305 provided on the second substrate 1310. In another example embodiment, the nonvolatile memory device 1000 may include both the first input/output pad 1205 and the second input/output pad 1305.

A metal pattern provided on an uppermost metal layer may be present as a dummy pattern or may not be present in each of the external pad bonding area PA and the bit line bonding area BLBA included in each of the cell region CELL and the peripheral circuit region PERI.

In the external pad bonding area PA, the nonvolatile memory device 1000 according to an example embodiment may include a lower metal pattern 1273a, provided on the uppermost metal layer in the peripheral circuit region PERI to correspond to an upper metal pattern 1372a provided on the uppermost metal layer in the cell region CELL, having the same cross-sectional shape as the upper metal pattern 1372a in the cell region CELL to be connected to each other. The lower metal pattern 1273a, provided on the uppermost metal layer in the peripheral circuit region PERI, may not be connected to an additional contact in the peripheral circuit region PERI. Similarly, in the external pad bonding area PA, the nonvolatile memory device 1000 may include an upper metal pattern 1372a, provided on the uppermost metal layer in the peripheral circuit region PERI to correspond to a lower metal pattern 1273a provided on the uppermost metal layer in the peripheral circuit region PERI, having the same shape as the lower metal pattern 1273a in the peripheral circuit region PERI.

Lower bonding metals 1271b and 1272b may be provided on the second metal layer 1240b in the word line bonding region WLBA. In an example embodiment, in the word line bonding area WLBA, the lower bonding metals 1271b and 1272b in the peripheral circuit area PERI may be electrically connected to the upper bonding metals 1371b and 1372b in the cell region CELL by a Cu-to-Cu bonding.

Further, in the bit line bonding area BLBA, the nonvolatile memory device 1000 may include an upper metal pattern 1392, provided on the uppermost metal layer in the cell region CELL to correspond to the lower metal pattern 1252 provided on the uppermost metal layer in the peripheral circuit region PERI, having the same cross-sectional shape as the lower metal pattern 1252 in the peripheral circuit region PERI. A contact may not be formed on the upper metal pattern 1392 provided on the uppermost metal layer in the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The inventive concept may be applicable to a data server system.

Figure 21:
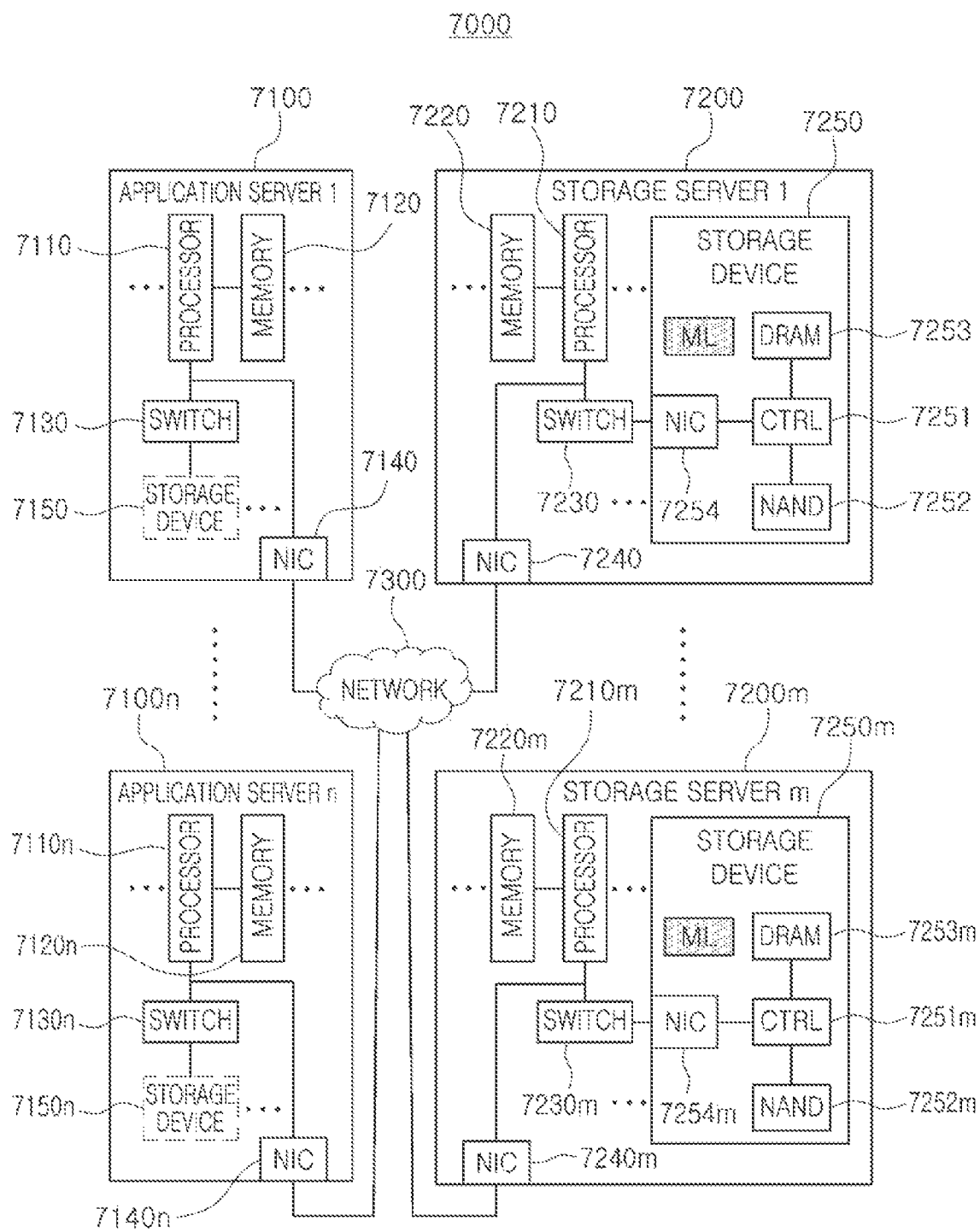
FIG. 21 is a view illustrating a data center to which a memory device according to an embodiment of the inventive concept is applied.

FIG. 21 is a view illustrating a data center to which a memory device according to an embodiment of the inventive concept is applied. Referring to FIG. 21, a data center 7000 may be a facility that collects various types of data and provides services, and may be referred to as a data storage center. The data center 7000 may be a system for operating a search engine and a database, and may be a computing system used by a company such as a bank or the like, or a government institution. The data center 7000 may include application servers 7100 to 7100n and storage servers 7200 to 7200m. The number of application servers 7100 to 7100n and the number of storage servers 7200 to 7200m may be variously selected according to embodiments, and the number of application servers 7100 to 7100n may be different from the number of storage servers 7200 to 7200m.

An application server 7100 and a storage server 7200 may include any one or any combination of processors 7110 and 7210 and memories 7120 and 7220, respectively. When describing the storage server 7200 as an example, a processor 7210 may control an overall operation of the storage server 7200, and may access a memory 7220 to execute a command or data loaded in the memory 7220. The memory 7220 may be a double data rate synchronous DRAM (DDR SDRAM), a high bandwidth memory (HBM), a hybrid memory cube (HMC), a dual in-line memory module (DIMM), an Optane DIMM, or a non-volatile DIMM (NVMDIMM). According to an embodiment, the number of processors 7210 and the number of memories 7220 included in the storage server 7200 may be variously selected.

In an embodiment, the processor 7210 and the memory 7220 may provide a processor-memory pair. In an embodiment, the number of the processors 7210 may be different from the number of the memories 7220. The processor 7210 may include a single core processor or a multiple core processor. The description of the storage server 7200 may be similarly applied to the application server 7100. According to an embodiment, the application server 7100 may not include a storage device 7150. The storage server 7200 may include at least one storage device 7250. The storage device 7250 may be implemented to perform a heterogeneous multi-sensing operation according to the health checkup command illustrated in FIGS. 1 to 20. This heterogeneous multi-sensing operation may be performed by machine learning (ML). For example, the storage device 7250 may be implemented to operate a machine learning-based defense code. The number of storage devices 7250 included in the storage server 7200 may be variously selected according to embodiments.

The application servers 7100 to 7100n and the storage servers 7200 to 7200m may communicate with each other via a network 7300. The network 7300 may be implemented using a fiber channel (FC) or Ethernet. In this case, the FC may be a medium used for relatively high-speed data transmission, and may use an optical switch that provides high performance/high availability. Depending on an access method of the network 7300, the storage servers 7200 to 7200m may be provided as file storage, block storage, or object storage.

In an embodiment, the network 7300 may be a storage-only network such as a storage area network (SAN). For example, the SAN may be an FC-SAN using an FC network and implemented according to an FC protocol (FCP). For another example, the SAN may be an IP-SAN using a TCP/IP network and implemented according to an SCSI over TCP/IP or Internet SCSI (iSCSI) protocol. In another embodiment, the network 7300 may be a general network such as a TCP/IP network. For example, the network 7300 may be implemented according to protocols such as an FC over Ethernet (FCoE) protocol, a network attached storage (NAS) protocol, an NVMe over Fabrics (NVMe-oF) protocol, or the like.

In the following, description will be made focusing on the application server 7100 and the storage server 7200. The description of the application server 7100 may be applied to other application servers 7100n, and the description of the storage server 7200 may be applied to other storage servers 7200m.

The application server 7100 may store data, requested to be stored by a user or a client, in one of the storage servers 7200 to 7200m via the network 7300. In addition, the application server 7100 may acquire data, requested to be read by a user or a client, from one of the storage servers 7200 to 7200m via the network 7300. For example, the application server 7100 may be implemented as a web server, a database management system (DBMS), or the like.

The application server 7100 may access a memory 7120n or a storage device 7150n included in the other application server 7100n via the network 7300, or may access memories 7220 to 7220m or storage devices 7250 to 7250m included in the storage servers 7200 to 7200m via the network 7300. Therefore, the application server 7100 may perform various operations for data stored in the application servers 7100 to 7100n or the storage servers 7200 to 7200m. For example, the application server 7100 may execute a command for moving or copying data between the application servers 7100 to 7100n or the storage servers 7200 to 7200m. In this case, the data may move from the storage devices 7250 to 7250m of the storage servers 7200 to 7200m to the memories 7120 to 7120n of the application servers 7100 to 7100n via the memories 7220 to 7220m of the storage servers 7200 to 7200m, or may directly move from the storage devices 7250 to 7250m of the storage servers 7200 to 7200m to the memories 7120 to 7120n of the application servers 7100 to 7100n. Data moving via the network 7300 may be encrypted data for security or privacy.

Referring to the storage server 7200 as an example, an interface 7254 may provide a physical connection between the processor 7210 and a controller 7251 and a physical connection between an NIC 7240 and the controller 7251. For example, the interface 7254 may be implemented by a direct attached storage (DAS) method in which the storage device 7250 is directly connected by a dedicated cable. In addition, for example, the interface 7254 may be implemented by various interface methods such as an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI express (PCIe) interface, an NVM express (NVMe) interface, IEEE 1394, an universal serial bus (USB) interface, a secure digital (SD) card interface, a multi-media card (MMC) interface, an embedded multi-media card (eMMC) interface, a universal flash storage (UFS) interface, an embedded universal flash storage (eUFS) interface, a compact flash (CF) card interface, or the like.

The storage server 7200 may further include a switch 7230 and an NIC 7240. The switch 7230 may selectively connect the processor 7210 and the storage device 7250 or may selectively connect the NIC 7240 and the storage device 7250 according to control of the processor 7210.

In an embodiment, the NIC 7240 may include a network interface card, a network adapter, or the like. The NIC 7240 may be connected to the network 7300 via a wired interface, a wireless interface, a Bluetooth interface, an optical interface, or the like. The NIC 7240 may include an internal memory, a DSP, a host bus interface, or the like, and may be connected to the processor 7210, the switch 7230, or the like via a host bus interface. The host bus interface may be implemented as one of the examples of the interface 7254 described above. In an embodiment, the NIC 7240 may be integrated with any one or any combination of the processor 7210, the switch 7230, and the storage device 7250.

In the storage servers 7200 to 7200m or the application servers 7100 to 7100n, the processor may transmit a command to the storage devices 7150 to 7150n and 7250 to 7250m or the memories 7120 to 7120n and 7220 to 7220m, to program or read data. In this case, the data may be data that has been error-corrected by an error correction code (ECC) engine. The data may be data that has been processed by data bus inversion (DBI) or data masking (DM), and may include cyclic redundancy code (CRC) information. The data may be encrypted data for security or privacy.

The storage devices 7150 to 7150n and 7250 to 7250m may transmit a control signal and a command/address signal to NAND flash memory devices 7252 to 7252m in response to a read command received from a processor. Therefore, when data are read from the NAND flash memory devices 7252 to 7252m, a read enable (RE) signal may be input as a data output control signal, and may serve to output data to a DQ bus. The RE signal may be used to generate a data strobe (DQS). The command and address signals may be latched in a page buffer according to a rising edge or a falling edge of a write enable (WE) signal.

The controller 7251 may thoroughly control an operation of the storage device 7250. In an embodiment, the controller 7251 may include a static random access memory (SRAM). The controller 7251 may write data to the NAND flash memory device 7252 in response to a write command, or may read data from the NAND flash memory device 7252 in response to a read command. For example, the write command or the read command may be provided from the processor 7210 in the storage server 7200, the processor 7210m in another storage server 7200m, or the processors 7110 and 7110n in the application servers 7100 and 7100n. A DRAM 7253 may temporarily store (buffer) data to be written to the NAND flash memory device 7252, or may temporarily store (buffer) data read from the NAND flash memory device 7252. Also, the DRAM 7253 may store metadata. In this case, the metadata may be user data, or may be data generated by the controller 7251 to manage the NAND flash memory device 7252. The storage device 7250 may include a secure element (SE) for security or privacy.

A non-volatile memory device according to an embodiment of the inventive concept may divide heterogeneous data, read by sampling on two or more read levels within a single ready & busy signal, into output data (Dout Data), and may output the same.

In an embodiment, anon-volatile memory device may sample data in 8K units from a NAND having a page of 16 Kbytes, and may output data read on two read levels within Dout data of a single page size. In an embodiment, 1st 8K Dout Data may be 1st Read level data, and 2nd 8K Dout Data may be 2nd Read level data.

In an embodiment, a non-volatile memory device may sample data in 4K units from a NAND having a page of 16 Kbytes, and may output data read on four read levels within Dout data of a single page size. In an embodiment, 1st/2nd/3rd/4th 4K Dout Data may be 1st/2nd/3rd/4th Read level data, respectively.

In an embodiment of the inventive concept, a non-volatile memory device may sample two or more different WLs within a single ready & busy signal, may divide read heterogeneous data into Dout Data, and may output the same.

A non-volatile memory device according to an embodiment of the inventive concept may divide heterogeneous data, read by sampling two or more different blocks within a single ready & busy signal, into Dout Data, and may output the same. In an embodiment, the controller may use the sampled and output Dout Data, to adjust the read level and read the data again. In an embodiment, the controller may use the sampled and output Dout Data to adjust a reclaim time point.

The contents of the inventive concept described above are only examples for carrying out the inventive concept. The inventive concept will include not only specific and practically usable means itself, but also technical ideas that may be abstract and conceptual ideas capable of being utilized as future technologies.

A non-volatile memory device according to an embodiment of the inventive concept, an operating method thereof, a controller for controlling the same, and a storage device having the same may perform a heterogeneous multi-sensing operation according to a health checkup command, to output cell state information more quickly.

A non-volatile memory device according to an embodiment of the inventive concept, an operating method thereof, a controller for controlling the same, and a storage device having the same may output cell state information without deteriorating system performance.

While embodiments have been illustrated and described above, it will be apparent to those skilled in the art that modifications and variations could be made without departing from the scope of the inventive concept as defined by the appended claims.

What is claimed is:

1. A non-volatile memory device comprising:
a memory cell array comprising a plurality of memory blocks having a plurality of memory cells connected to a plurality of wordlines and a plurality of bitlines;
a row decoder configured to select one of the plurality of memory blocks in response to an address;
a voltage generator configured to apply wordline voltages corresponding to selected wordlines and unselected wordlines, among the plurality of wordlines;
page buffers connected to the plurality of bitlines and configured to read data from a memory cell connected to a selected wordline of a selected memory block, among the plurality of memory blocks; and
a control logic configured to control the row decoder, the voltage generator, and the page buffers,
wherein the control logic is configured to receive a command from a controller, set a first sensing condition and a second sensing condition in response to the command, perform a first sensing operation according to the first sensing condition, and perform a second sensing operation according to the second sensing operation,
wherein first position information for the first sensing operation is different from second position information for the second sensing operation,
wherein the control logic is configured to latch first sampling data in a first page buffer group according to the first sensing operation, and second sampling data in a second page buffer group according to the second sensing operation, and perform a recovery operation related to the first and the second sensing operations.

2. The non-volatile memory device of claim 1, wherein the first and the second position information indicate different wordlines of a memory block among the plurality of memory blocks.

3. The non-volatile memory device of claim 1, wherein the first and the second position information indicate different memory blocks among the plurality of memory blocks.

4. The non-volatile memory device of claim 1, wherein the control logic is configured to return a read and busy signal to the controller after the recovery operation has been completed.

5. The non-volatile memory device of claim 1, wherein the first sampling data and the second sampling data are configured to be output to the controller in response to a request of the controller.

6. The non-volatile memory device of claim 5, wherein each of the first sampling data and the second sampling data are output to the controller using a direct memory access.

7. The non-volatile memory device of claim 5, wherein the control logic is configured to receive a read command with a new read level from the controller,
wherein the new read level is configured to be adjusted using the first sampling data and the second sampling data by the controller.

8. The non-volatile memory device of claim 5, wherein the control logic is configured to receive a reclaim request from the controller,
wherein time of the reclaim request is configured to be adjusted using the first sampling data and the second sampling data by the controller.

9. The non-volatile memory device of claim 1, wherein the first sensing condition and the second sensing condition comprise different read levels.

10. An operating method of a non-volatile memory device, comprising:
receiving a command from a controller;
setting a first sensing condition;
performing a first sensing operation in a first page buffer group according to the first sensing condition for latching first sampling data;
setting a second sensing condition;
performing a second sensing operation in a second page buffer group according to the second sensing condition for latching second sampling data;
performing a recovery operation related to the first and the second sensing operations;
returning a read and busy signal to the controller;
outputting the first sampling data using a first direct memory access; and
outputting the second sampling data using a second direct memory access, wherein first position information for the first sensing operation is different from second position information for the second sensing operation.

11. The method of claim 10, further comprising performing initialization of the first and the second page buffer groups.

12. The method of claim 11, wherein the performing initialization comprises:
performing first initialization of the first page buffer group before the first sensing operation; and
performing second initialization of the second page buffer group after the first sensing operation.

13. The method of claim 12, wherein the performing initialization comprises:
performing first initialization of the first page buffer group; and
performing second initialization of the second page buffer group,
wherein the first and the second initialization are performed before the first sensing operation.

14. The method of claim 10, wherein the performing recovery operation comprises performing a first recovery operation after the first sensing operation and performing a second recovery operation,
wherein the outputting the first sampling data is performed simultaneously with the second recovery operation of the second page buffer group.

15. A storage device comprising:
at least one non-volatile memory device; and
a controller configured to be connected to the at least one non-volatile memory device by control pins providing a command latch enable (CLE) signal, an address latch enable (ALE) signal, a chip enable (CE) signal, a write enable (WE) signal, a read enable (RE) signal, and a data strobe (DQS) signal, and read data from the at least one non-volatile memory,
wherein the at least one non-volatile memory device is configured to latch a command at an edge of the WE signal according to the CLE signal and the ALE signal, set a plurality of sensing conditions in respond to the command, perform a plurality of sensing operations using corresponding sensing conditions among the plurality of sensing operations respectively, and output sampling data corresponding to the plurality of sensing operations to the controller,
wherein position information corresponding to the plurality of sensing operations is different from each other.

16. The storage device of claim 15, wherein the plurality of sensing operations comprise four sensing operations using different four real levels.

17. The storage device of claim 16, wherein at least one of four read levels corresponds an erase state or a highest program state among a plurality of cell states.

18. The storage device of claim 16, wherein the at least one non-volatile memory device is configured to output the sampling data by a page size.

19. The storage device of claim 16, wherein the at least one non-volatile memory device is configured to calculate the sampling data according to the plurality of sensing operations, store the calculated data, and output the stored data by a page size.

* * * * *